(12) United States Patent
Kamata

(10) Patent No.: US 9,768,319 B2
(45) Date of Patent: Sep. 19, 2017

(54) MODULATION CIRCUIT AND SEMICONDUCTOR DEVICE INCLUDING THE SAME

(71) Applicant: Semiconductor Energy Laboratory Co., Ltd., Atsugi-shi, Kanagawa-ken (JP)

(72) Inventor: Koichiro Kamata, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/159,182

(22) Filed: May 19, 2016

(65) Prior Publication Data

US 2016/0336455 A1 Nov. 17, 2016

Related U.S. Application Data

(63) Continuation of application No. 12/948,225, filed on Nov. 17, 2010, now Pat. No. 9,350,295.

(30) Foreign Application Priority Data

Nov. 20, 2009 (JP) .................. 2009-265054

(51) Int. Cl.
*H01L 29/78* (2006.01)
*H01L 29/786* (2006.01)
(Continued)

(52) U.S. Cl.
CPC .... *H01L 29/7869* (2013.01); *G06K 19/07775* (2013.01); *H01L 23/66* (2013.01);
(Continued)

(58) Field of Classification Search
CPC ................................................ H01L 29/7869
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2105967 A | 9/2009 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Joseph Chang
(74) *Attorney, Agent, or Firm* — Robinson Intellectual Property Law Office; Eric J. Robinson

(57) ABSTRACT

A modulation circuit includes a load and a transistor serving as a switch. The transistor has an oxide semiconductor layer in which hydrogen concentration is $5 \times 10^{19}/cm^3$ or less. The off-state current of the transistor is $1 \times 10^{-13}$ A or less. A modulation circuit includes a load, a transistor serving as a switch, and a diode. The load, the transistor, and the diode are connected in series between the terminals of an antenna. The transistor has an oxide semiconductor layer in which hydrogen concentration is $5 \times 10^{19}/cm^3$ or less. An off-state current of the transistor is $1 \times 10^{-13}$ A or less. On/off of the transistor is controlled in accordance with a signal inputted to a gate of the transistor. The load is a resistor, a capacitor, or a combination of a resistor and a capacitor.

21 Claims, 20 Drawing Sheets

(51) Int. Cl.
*H03C 1/36* (2006.01)
*G06K 19/077* (2006.01)
*H01L 23/66* (2006.01)
*H01L 27/06* (2006.01)
*H01L 49/02* (2006.01)

(52) U.S. Cl.
CPC .......... *H01L 27/0629* (2013.01); *H01L 28/20* (2013.01); *H01L 28/40* (2013.01); *H01L 29/78693* (2013.01); *H01L 29/78696* (2013.01); *H03C 1/36* (2013.01); *H01L 2223/6677* (2013.01); *H04M 2201/04* (2013.01); *H04M 2201/06* (2013.01)

(58) Field of Classification Search
USPC ........................................................ 332/178
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,792,050 B1 | 9/2004 | Shiikuma et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,699,232 B2 | 4/2010 | Koyama et al. |
| 7,732,819 B2 | 6/2010 | Akimoto et al. |
| 7,791,074 B2 | 9/2010 | Iwasaki |
| 7,829,444 B2 | 11/2010 | Yabuta et al. |
| 7,935,582 B2 | 5/2011 | Iwasaki |
| 7,956,361 B2 | 6/2011 | Iwasaki |
| 8,084,331 B2 | 12/2011 | Ofuji et al. |
| 8,154,024 B2 | 4/2012 | Iwasaki |
| 8,188,480 B2 | 5/2012 | Itai |
| 8,338,931 B2 | 12/2012 | Dozen et al. |
| 8,358,202 B2 | 1/2013 | Takahashi |
| 8,421,068 B2 | 4/2013 | Yamazaki et al. |
| 8,530,246 B2 | 9/2013 | Ofuji et al. |
| 8,627,170 B2 | 1/2014 | Ito et al. |
| 8,642,402 B2 | 2/2014 | Yano et al. |
| 8,785,240 B2 | 7/2014 | Watanabe |
| 9,129,866 B2 | 9/2015 | Asami et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0048570 A1 | 3/2004 | Oba et al. |
| 2004/0127038 A1 | 7/2004 | Carcia et al. |
| 2004/0180637 A1 | 9/2004 | Nagai et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0249398 A1 | 10/2007 | Watanabe et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0212346 A1 | 9/2008 | Rizzo et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236596 A1 | 9/2009 | Itai |
| 2009/0278122 A1 | 11/2009 | Hosono et al. |
| 2009/0280600 A1 | 11/2009 | Hosono et al. |
| 2009/0284310 A1 | 11/2009 | Koyama et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0134256 A1 | 6/2010 | Mihota |
| 2010/0149138 A1 | 6/2010 | Lee et al. |
| 2010/0267198 A1 | 10/2010 | Yabuta et al. |
| 2010/0289020 A1 | 11/2010 | Yano et al. |
| 2011/0073856 A1 | 3/2011 | Sato et al. |
| 2011/0092016 A1 | 4/2011 | Ofuji et al. |

FOREIGN PATENT DOCUMENTS

| | | |
|---|---|---|
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-088243 A | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-259927 A | 9/2002 |
| JP | 2002-289859 A | 10/2002 |
| JP | 2003-023366 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-251183 A | 9/2005 |
| JP | 2006-165531 A | 6/2006 |
| JP | 2007-103918 A | 4/2007 |
| JP | 2008-181499 A | 8/2008 |
| JP | 2008-281988 A | 11/2008 |
| JP | 2009-118071 A | 5/2009 |
| JP | 2009-212443 A | 9/2009 |
| JP | 2009-224479 A | 10/2009 |
| JP | 2009-231613 A | 10/2009 |
| WO | WO-2004/114391 | 12/2004 |
| WO | WO-20071029844 | 3/2007 |
| WO | WO-2008/096768 | 8/2008 |
| WO | WO-2008/126879 | 10/2008 |
| WO | WO-2009/075281 | 6/2009 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000 ° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.n. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda,K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Parks et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka,M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, Vol, 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42,1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park. Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.n. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

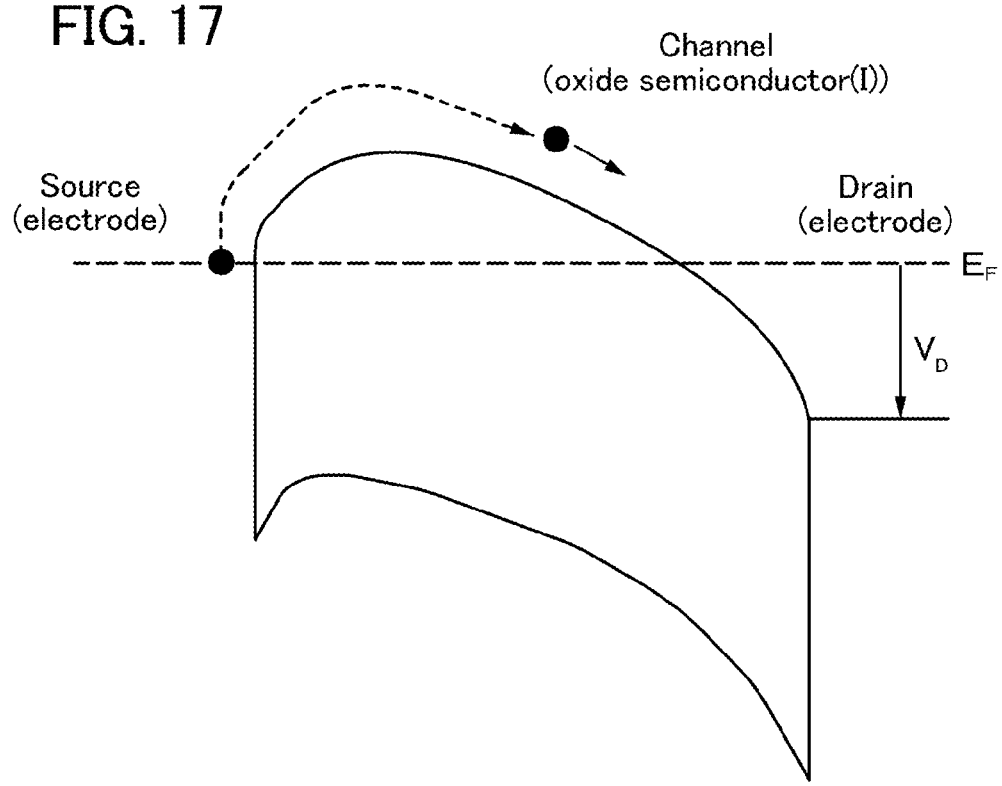

MODULATION CIRCUIT AND SEMICONDUCTOR DEVICE INCLUDING THE SAME

BACKGROUND OF THE INVENTION

1. Field of the Invention

The present invention relates to a semiconductor device, particularly to a modulation circuit. Further, the present invention relates to a semiconductor device (a data carrier) capable of wirelessly communicating (transmitting and receiving) data.

2. Description of the Related Art

In recent years, individual identification technologies have attracted attention. In these technologies, an ID number (an identification number) is assigned to each individual object, thereby revealing the information history of individual objects. These technologies are utilized for production, management, or the like. In particular, RFID (radio frequency identification) technologies used for sending and receiving data by wireless communication are spreading. A wireless communication system using RFID technologies includes a radio communication device (an interrogator) and a data carrier (a responder), and data is wirelessly transferred between them. The radio communication device refers to a device capable of wirelessly sending and receiving signals, such as a reader/writer, a cellular phone, and a personal computer; in this specification, it is referred to as a reader/writer. The data carrier is generally called an RF tag, an ID tag, an IC tag, an IC chip, a wireless tag, an electronic tag, or the like; in this specification, it is referred to as an RF tag.

An RF tag includes a variety of circuits needed in order for data to be wirelessly transferred between the RF tag and a reader/writer. One example of such a variety of circuits is a modulation circuit. A modulation circuit has a function of modulating a carrier wave outputted from a reader/writer in response to a response signal outputted from a logic circuit, and then sending a response signal to the reader/writer.

Known methods for sending a response signal to a reader/writer include a load modulation method (load switching method) in which modulation is performed by changing the load impedance between the two terminals of an antenna included in an RF tag (see Patent Document 1, for example).

REFERENCE

[Patent Document 1] Japanese Published Patent Application No. 2005-251183

SUMMARY OF THE INVENTION

A modulation circuit that employs a load modulation method includes a switching element and a load. A transistor whose channel formation region is formed using silicon is used as the switching element. However, in a transistor whose channel formation region is formed using silicon, off-state current (also referred to as leakage current) which occurs when the transistor is in the off state is high, which increases power consumption. This results in a reduction in the reliability of RFID communication.

In view of the above problem, an object of one embodiment of the present invention is to reduce the power consumption of a modulation circuit. Another object of one embodiment of the present invention is to reduce the power consumption of a semiconductor device having a modulation circuit by reducing the power consumption of the modulation circuit. Another object of one embodiment of the present invention is to increase the maximum communication distance of an RF tag having a modulation circuit by reducing the power consumption of the RF tag having a modulation circuit. Another object of one embodiment of the present invention is to improve the response reliability of the RF tag.

In order to achieve at least one of the above objects, one embodiment of the present invention employs the following structure. According to one embodiment of the present invention, a transistor having an oxide semiconductor layer is used in a modulation circuit. In addition, the concentration of hydrogen contained in the oxide semiconductor layer is $5\times10^{19}/cm^3$ or less, and the off-state current of the transistor having an oxide semiconductor layer is $1\times10^{-13}$ A or less.

According to one embodiment of the present invention, a modulation circuit includes a load and a transistor serving as a switch. The transistor has an oxide semiconductor layer in which hydrogen concentration is less than or equal to $5\times10^{19}/cm^3$. The off-state current of the transistor is less than or equal to $1\times10^{-13}$ A.

According to one embodiment of the present invention, a modulation circuit includes a load and a transistor serving as a switch. One of a source and a drain of the transistor is electrically connected to one terminal of an antenna through the load, and the other of the source and the drain of the transistor is electrically connected to the other terminal of the antenna. The transistor has an oxide semiconductor layer in which hydrogen concentration is less than or equal to $5\times10^{19}/cm^3$. An off-state current of the transistor is less than or equal to $1\times10^{-13}$ A.

According to one embodiment of the present invention, a modulation circuit includes a load, a transistor serving as a switch, and a diode. The load, the transistor, and the diode are connected in series between the terminals of an antenna. The transistor has an oxide semiconductor layer in which hydrogen concentration is less than or equal to $5\times10^{19}/cm^3$. An off-state current of the transistor is less than or equal to $1\times10^{-13}$ A.

According to one embodiment of the present invention, the diode is a diode-connected transistor.

According to one embodiment of the present invention, on/off of the transistor is controlled in accordance with a signal inputted to a gate of the transistor.

According to one embodiment of the present invention, the load is a resistor, a capacitor, or a combination of a resistor and a capacitor.

According to one embodiment of the present invention, a semiconductor device includes the modulation circuit, an antenna, a rectifier circuit, a demodulation circuit, a constant voltage circuit, and a logic circuit. In addition, the semiconductor device further includes a clock generation circuit.

According to one embodiment of the present invention, a semiconductor device includes the modulation circuit.

According to one embodiment of the present invention, a cellular phone includes the modulation circuit.

The semiconductor device (RF tag) according to one embodiment of the present invention does not depend on the frequency band used for communication with a reader/writer and is applicable to an RF tag using any given frequency band. Specifically, the RF tag according to one embodiment of the present invention can employ any of the following frequency bands: the HF band of 3 MHz to 30 MHz (e.g., 13.56 MHz), the UHF band of 300 MHz to 3 GHz (e.g., 433 MHz, 953 MHz, or 2.45 GHz), and a frequency of 135 kHz.

Examples of the RF tags according to one embodiment of the present invention include any products capable of wireless data communication, such as ID tags, IC tags, IC chips, wireless tags, and electronic tags.

In addition, the modulation circuit according to one embodiment of the present invention can be used in a semiconductor device other than an RF tag. For example, a semiconductor device such as an cellular phone or a personal computer (preferably a laptop personal computer) is capable of transmitting and receiving data to/from a reader/writer when provided with the modulation circuit according to one embodiment of the present invention.

The source and drain of a transistor are difficult to distinguish from one another because of the structure of the transistor. Further, high potential and low potential might be interchanged depending on the circuit operation. Therefore, in this specification, a source and a drain are not determined and each may be referred to as a first electrode (or a first terminal) or a second electrode (or a second terminal). For example, when a first electrode is a source, a second electrode is a drain, whereas when a first electrode is a drain, a second electrode is a source.

In this specification, the description "A and B are connected to each other" means that A and B are electrically connected to each other (i.e., A and B are connected to each other with another element or circuit placed therebetween), A and B are functionally connected to each other (i.e., A and B are functionally connected to each other with another circuit placed therebetween), A and B are directly connected to each other (i.e., A and B are connected to each other without any other elements or circuits placed therebetween), or the like.

Terms such as "first", "second", "third", "to N (N is a natural number)" used in this specification are used just for preventing confusion between components, and thus do not limit number. For example, in this specification, the expression "first transistor" can be read as "second transistor" as long as there is no confusion between components.

One embodiment of the present invention can reduce the power consumption of a modulation circuit. Reducing the power consumption of the modulation circuit can reduce the power consumption of a semiconductor device having the modulation circuit. Reducing the power consumption of an RF tag having a modulation circuit can increase the maximum communication distance of the RF tag. In addition, one embodiment of the present invention can achieve improvement in the reliability of a semiconductor device having a modulation circuit.

BRIEF DESCRIPTION OF THE DRAWINGS

FIG. 17 shows the state where positive voltage is applied to the drain in the structure of FIG. 16.
FIG. 18A shows the case where gate voltage is positive,
and FIG. 18B shows the case where the gate voltage is negative.

DETAILED DESCRIPTION OF THE INVENTION

Figure 1:
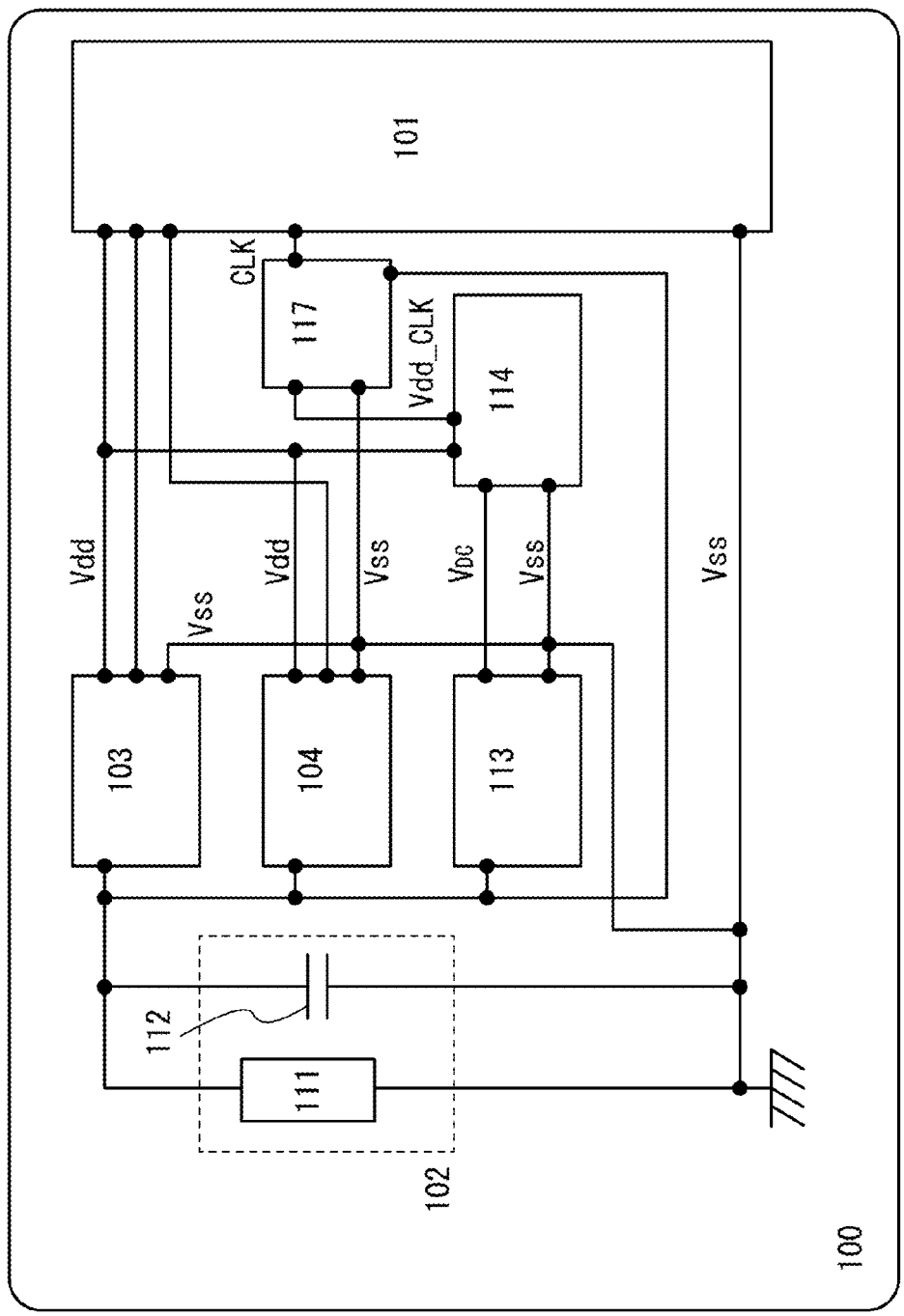
FIG. 1 is a block diagram showing a whole RF tag.

Embodiments of the present invention will be described in detail with reference to the accompanying drawings. Note that the present invention is not defined to description below, and it is easily understood by those skilled in the art that modes and details can be modified in various ways without departing from the purpose and the scope of the present invention. Therefore, in the embodiments and example of the present invention which will be described below, the same portions are commonly denoted by the same reference numerals in different drawings.

In addition, each of the embodiments described below can be implemented by being combined with any of the other embodiments and example which are described in this specification unless otherwise mentioned.

Embodiment 1

FIG. 1 shows the block diagram of the whole RF tag which is used as one embodiment of the present invention. An RF tag 100 include: a logic circuit 101 which carries out functional processing, e.g. generates a response signal in response to data received; an antenna circuit 102 which sends and receives signals to/from (communicates with) a reader/writer; a demodulation circuit 103 which demodulates an amplitude-modulated wave (obtained by superimposing a modulated wave on a carrier wave) received by the antenna circuit 102 to extract a pulsed signal; a modulation circuit 104 which modulates a carrier wave outputted from the reader/writer in response to a response signal outputted from the logic circuit 101 and transmitting a response signal to the reader/writer; a rectifier circuit 113 for generating a DC voltage from a carrier wave or amplitude-modulated wave received by the antenna circuit 102; a constant-voltage circuit 114 which converts DC voltage generated by the rectifier circuit 113 into constant power potential; and a clock generation circuit 117.

As described above, the RF tag 100 includes a plurality of circuits needed for wireless data communication with a reader/writer. One embodiment of the present invention is characterized by particularly the modulation circuit 104 among these circuits. The details of the modulation circuit will be described in and after Embodiment 2.

The antenna circuit 102 includes an antenna 111 and a resonant capacitor 112. The capability of receiving a carrier wave from a reader/writer varies depending on the shape or the like of the antenna 111; there is no particular limitation on the shape or the like of the antenna 111 in the present invention. The resonant capacitor 112 is a capacitor provided to optimize the resonance frequency of the antenna circuit 102 to the frequency of a carrier wave from a reader/writer, being combined with the antenna 111. Note that the resonant capacitor 112 is not necessarily provided although provided in this embodiment. In the case where the resonant capacitor 112 is not provided, the frequency of the carrier wave from the reader/writer is optimized only by the antenna 111.

The rectifier circuit 113 has a function of rectifying a carrier wave or amplitude-modulated wave received by the antenna circuit 102 and generating DC voltage $V_{DC}$. The value of a DC voltage $V_{DC}$ generated by the rectifier circuit 113 changes depending on the power changed in accordance with the amplitude of a carrier wave. The higher the power is, the higher the DC voltage $V_{DC}$ becomes. The lower the power is, the lower the DC voltage $V_{DC}$ becomes.

The constant voltage circuit 114 has a function of converting the DC voltage $V_{DC}$, which varies depending on the magnitude of power, into a constant power potential Vdd (also referred to as a high power potential) and supplying Vdd to the logic circuit 101. Changes in potential applied to the logic circuit 101 cause the logic circuit 101 to operate unstably. For this reason, a constant potential needs to be supplied to the logic circuit 101. In this embodiment, the constant voltage circuit 114 supplies the constant power potential Vdd to the logic circuit 101. The low power potential (hereinafter referred to as $V_{SS}$) is common to circuits in the RF tag 100. For example, the $V_{SS}$ can be GND (=0 V).

The clock generation circuit 117 has a function of generating a clock signal CLK needed for the operation of the logic circuit 101 in response to a carrier wave or amplitude-modulated wave received by the antenna circuit 102, and supplying the clock signal CLK to the logic circuit 101. Examples of the clock generation circuit 117 include a circuit which generates, from an inputted carrier wave, a rectangular wave having the same frequency as the carrier wave by using an analog-digital converter; reduces the frequency of the rectangular wave to that suitable for circuit operation (e.g., 1/16 of the frequency of the carrier wave) by using a frequency divider circuit; and outputs a thus generated signal as a clock signal CLK. The clock generation circuit 117, however, is not limited to such a circuit.

The clock generation circuit 117 needs to have a function of stably supplying a clock signal CLK having a constant frequency to the logic circuit 101. Therefore, like the logic circuit 101 described above, a constant potential needs to be supplied to the clock generation circuit 117.

The constant potential applied to the clock generation circuit 117 can be the power potential Vdd generated by the constant voltage circuit 114, as in the logic circuit 101. However, the power potential Vdd is also applied to other circuits. In the case where the power potential Vdd may fluctuate depending on the operation of such other circuits, it is preferable to generate, in the constant voltage circuit 114, another power potential Vdd_CLK which is different from the power potential Vdd applied to such other circuits, and apply the power potential Vdd_CLK to the clock generation circuit 117. This enables the clock generation circuit 117 to supply the clock signal CLK having a constant frequency to the logic circuit 101, easily and stably.

Figure 2:
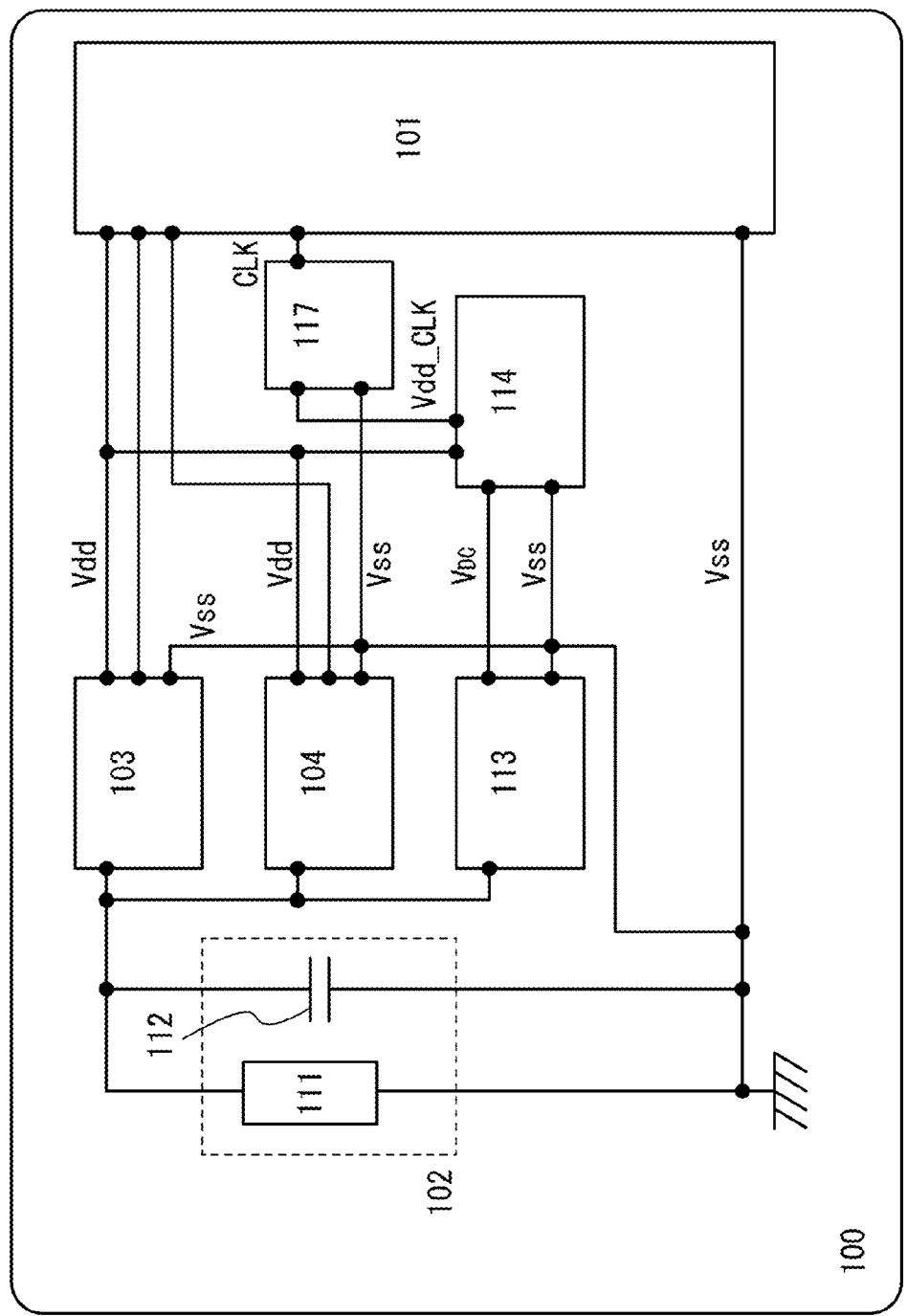
FIG. 2 is a block diagram showing a whole RF tag.

FIG. 2 is a block diagram showing the whole RF tag which is used as one embodiment of the present invention. Unlike the clock generation circuit 117 in FIG. 1, the clock generation circuit 117 in FIG. 2 generates the clock signal CLK needed for the operation of the logic circuit 101 without referring to a carrier wave or amplitude-modulated wave received by the antenna circuit, and supplies the clock signal CLK to the logic circuit 101. An example of such a clock generation circuit is, but not limited to, an oscillation circuit such as a ring oscillator. Note that in the RF tag 100 shown in FIG. 2, the circuits other than the clock generation circuit 117 can be similar to those in the RF tag 100 shown in FIG. 1, and are not described here.

Embodiment 2

In this embodiment, the configuration of the modulation circuit described in Embodiment 1 will be described.

Figure 3:
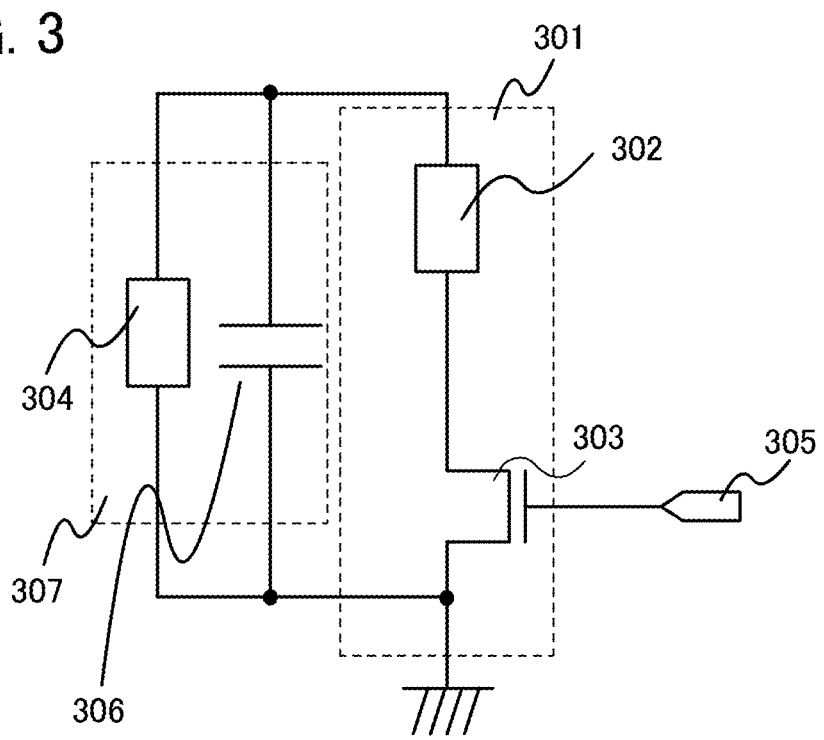
FIG. 3 is a circuit diagram showing an example of a modulation circuit.

FIG. 3 shows an example of the circuit configuration of the modulation circuit according to one embodiment of the present invention. A modulation circuit 301 employs a load modulation method, and includes a load 302 and a transistor 303. One of the source and drain of the transistor 303 is electrically connected to one terminal of an antenna 304 through the load 302. The other of the source and drain is electrically connected to the other terminal of the antenna 304. The on/off of the transistor 303 is controlled in accordance with a signal 305 inputted to the gate of the transistor 303. Note that the signal 305 inputted to the gate of the transistor 303 is a binary signal with high (H) or low (L), and corresponds to a response signal outputted from the logic circuit (also referred to as a subcarrier).

In this manner, the modulation circuit 301 using a load modulation method has a function of making the impedance between the two terminals of the antenna variable by controlling the on/off of the transistor in accordance with a response signal from the logic circuit, and then sending data to a reader/writer.

Note that the antenna described in this specification is a balanced device; therefore, a sine wave with a certain frequency is inputted to each of the two terminals of the antenna. A signal inputted to one terminal of the antenna and a signal inputted to the other terminal of the antenna are 180° out of phase with each other. However, in order to briefly describe the circuit, the potential of the other terminal of the antenna is regarded as fixed potential (0 V). Furthermore, this applies not only to this embodiment but also to the other embodiments and examples.

FIG. 3 shows an antenna circuit 307 including the antenna 304 and a resonance capacitor 306, for example; the present invention, however, is not limited to this configuration. In other words, the antenna circuit 307 can include only the antenna 304. This applies not only to the configuration of the antenna in this embodiment but also to the configuration of antennas in the other embodiments.

Figure 4:
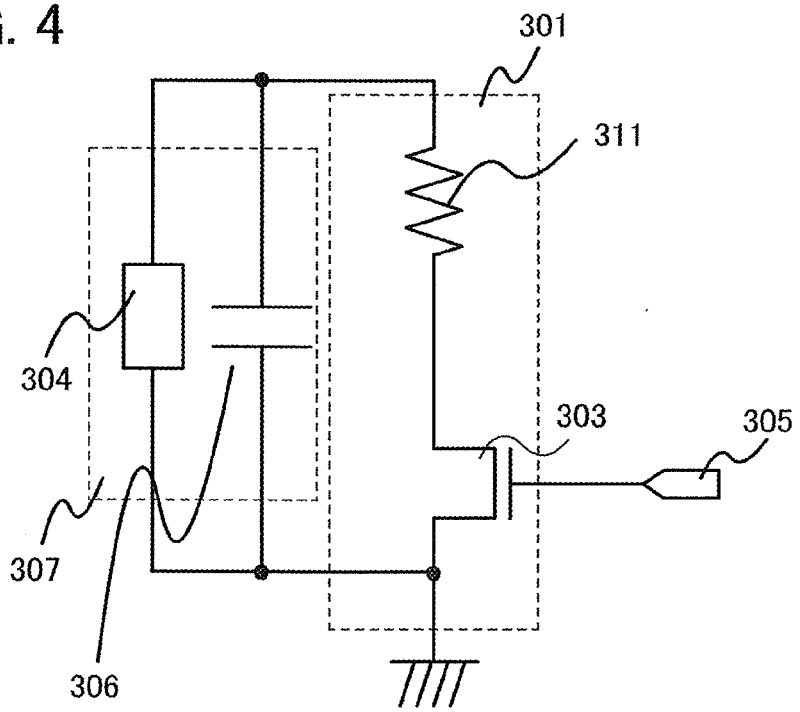
FIG. 4 is a circuit diagram showing an example of a modulation circuit.

The load 302 can be a resistor, a capacitor, or a combination of a resistor and a capacitor. FIG. 4 shows an example of the configuration of the modulation circuit using a resistor as the load 302. In this case, one terminal of a resistor 311 is electrically connected to one terminal of the antenna 304, and the other terminal of the resistor 311 is electrically connected to one of the source and drain of the transistor 303.

Figure 5:
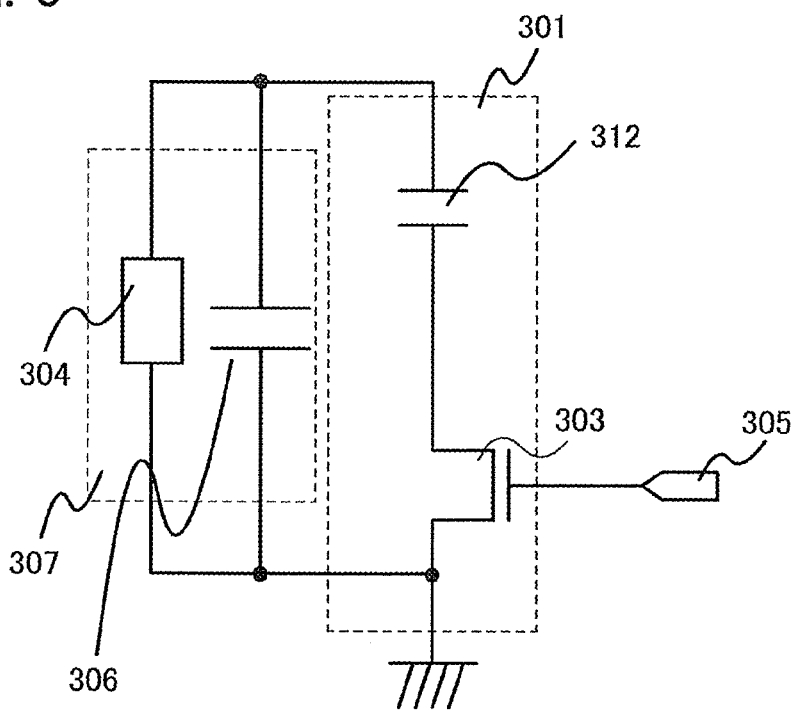
FIG. 5 is a circuit diagram showing an example of a modulation circuit.

FIG. 5 shows an example of the configuration of the modulation circuit using a capacitor as the load 302. In this case, one electrode of a capacitor 312 is electrically connected to one terminal of the antenna 304, and the other electrode of the capacitor 312 is electrically connected to one of the source and drain of the transistor 303.

Figure 6:
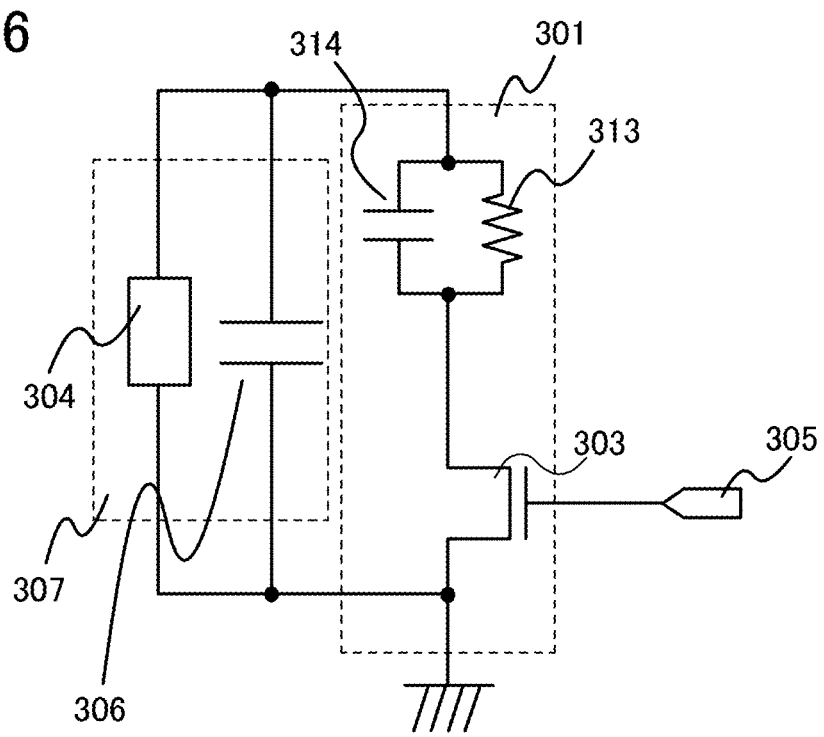
FIG. 6 is a circuit diagram showing an example of a modulation circuit.

FIG. 6 shows an example of the configuration of the modulation circuit using a resistor and a capacitor as the load 302. In this case, a resistor 313 and a capacitor 314 are connected to each other in parallel. One terminal of the resistor 313 and one electrode of the capacitor 314 are electrically connected to one terminal of the antenna 304. The other terminal of the resistor 313 and the other electrode of the capacitor 314 is electrically connected to one of the source and drain of the transistor 303.

In this case, the transistor 303 shown in FIG. 3, FIG. 4, FIG. 5, and FIG. 6 serves as a switch. Therefore, ideal characteristics of the transistor 303 needed for more stable operation of the modulation circuit 301 are as follows: when a signal inputted to the gate is one of H and L, the resistance of the transistor 303 is nearly infinite (∞), and when a signal inputted to the gate is the other of H and L, the resistance of the transistor 303 is nearly zero (0). For example, assuming that the transistor 303 is an n-channel transistor, the resistance of the transistor 303 is preferably nearly infinite (∞) when a signal inputted to the gate is L, and the resistance of the transistor 303 is preferably nearly zero (0) when a signal inputted to the gate is H. Note that there is no particular limitation on the conductivity type of the transistor 303; the transistor 303 can be either an n-channel transistor or a p-channel transistor.

In view of this, the channel formation region of the transistor 303 according to this embodiment is formed using an oxide semiconductor material to bring the operation of the modulation circuit to ideal one. In this oxide semiconductor material, the amount of impurities adversely affecting the electric characteristics of the transistor is reduced to extremely small, and this oxide semiconductor material is thus of high purity. A typical example of the impurity adversely affecting the electric characteristics is hydrogen. A hydrogen atom may act as a carrier donor, which provides carriers, in an oxide semiconductor material. An oxide semiconductor material is n-type when containing a large amount of hydrogen. Thus, a transistor using an oxide semiconductor material containing a large amount of hydrogen is normally on. Further, the on/off ratio of the transistor cannot be sufficiently high. Therefore, in this specification, a "high-purity oxide semiconductor material" refers to an oxide semiconductor material in which the amount of hydrogen is reduced to as small as possible and which is intrinsic or substantially intrinsic. One example of the high-purity oxide semiconductor material is an oxide semiconductor material in which the hydrogen concentration is $5\times10^{19}/cm^3$ or less, preferably $5\times10^{18}/cm^3$ or less, more preferably $5\times10^{17}/cm^3$ or less, still more preferably less than $1\times10^{16}/cm^3$. The transistor has a channel formation region formed using an oxide semiconductor material in which the carrier concentration in the oxide semiconductor material is less than $1\times10^{14}/cm^3$, preferably less than $1\times10^{12}/cm^3$, more preferably less than $1\times10^{11}/cm^3$, still more preferably less than $6.0\times10^{10}/cm^3$. Note that the concentration of hydrogen in the oxide semiconductor layer is measured by secondary ion mass spectroscopy (SIMS).

Further, it is preferable that the energy gap of the oxide semiconductor material be 2 eV or more, preferably 2.5 eV or more, more preferably 3 eV or more.

The high-purity semiconductor material obtained by thus removing hydrogen contained in the oxide semiconductor material thoroughly is used for the channel formation region of the transistor, thereby providing the transistor which provides extremely low off-state current. Specifically, the off-state current of a transistor using a high-purity oxide semiconductor material can be reduced to $1\times10^{-13}$ A or less, and preferably $1\times10^{-16}$ A or less. In other words, the resistance of the transistor 303 being in the off state can be increased without limit. This suppresses the power consumption of the modulation circuit. In addition, the on/off ratio of the transistor 303 can be relatively higher than that of a conventional one, which increases the degree of modulation produced by the modulation circuit.

For example, even when a transistor using a high-purity oxide semiconductor material has a channel length of 3 μm and a channel width of 10 mm, the drain current is $1\times10^{-13}$ A or less under the conditions that the drain voltage is 1 V or 10 V and the gate voltage ranges from −5 V to −20 V (i.e. under the conditions that the transistor is in the off state).

The characteristics of a transistor using a high-purity oxide semiconductor material will be described with reference to FIG. 16, FIG. 17, FIGS. 18A and 18B, FIG. 19, FIG. 20, FIGS. 21A and 21B, and FIGS. 22A and 22B.

Figure 16:
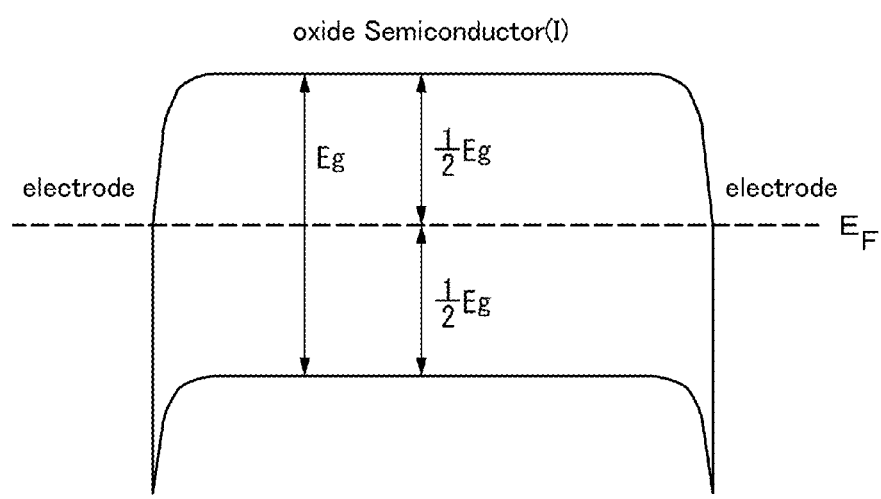
FIG. 16 shows a band structure between a source and a drain of a MOS transistor using an oxide semiconductor.

FIG. 16 shows the source-drain band structure of a transistor using a high-purity oxide semiconductor material. The Fermi level of the high-purity oxide semiconductor is ideally located in the center of the forbidden band. In an oxide semiconductor in which hydrogen concentration has been reduced, the number of minority carriers (holes in this case) is zero or extremely close to zero.

In this case, an equation expressing conditions for achieving a flat band structure of the interface between the metal and the oxide semiconductor is expressed as:

$$\phi_m = x - V_t \ln(N_d/N_c)$$

where $\phi m$ is work function, x is the electron affinity of the oxide semiconductor, $N_d$ is the carrier density (electron density) of the oxide semiconductor in thermal equilibrium, and $N_c$ is the effective density of states of the oxide semiconductor in the conduction band. Here, $V_t$ equals $k_b T/q$, where $k_b$ is Boltzmann constant and q is elementary charge.

An ohmic contact occurs when $\phi m < x$. In addition, when $\phi m < x$, the Fermi level of the electrode metal agrees with the level of the conduction band of the oxide semiconductor at their interface. When the band gap is 3.05 eV, the electron affinity is 4.3 eV, the oxide semiconductor is intrinsic (the carrier density is approximately $1\times10^{-7}/cm^3$), and the source electrode and the drain electrode is made of titanium (Ti) whose work function is 4.3 eV, barrier against electrons is not formed as shown in FIG. 16.

FIG. 17 shows a state where positive voltage is applied to the gate and the drain of a transistor using an oxide semiconductor material. Since the band gap of the oxide semiconductor is wide, the intrinsic carrier density of the high-purity oxide semiconductor which is intrinsic or substantially intrinsic is zero or extremely close to zero. However, it is understood that carriers (electrons) are injected from the source and flow to the drain when positive voltage is applied to the gate and voltage is applied between a source and a drain.

Figure 18A:
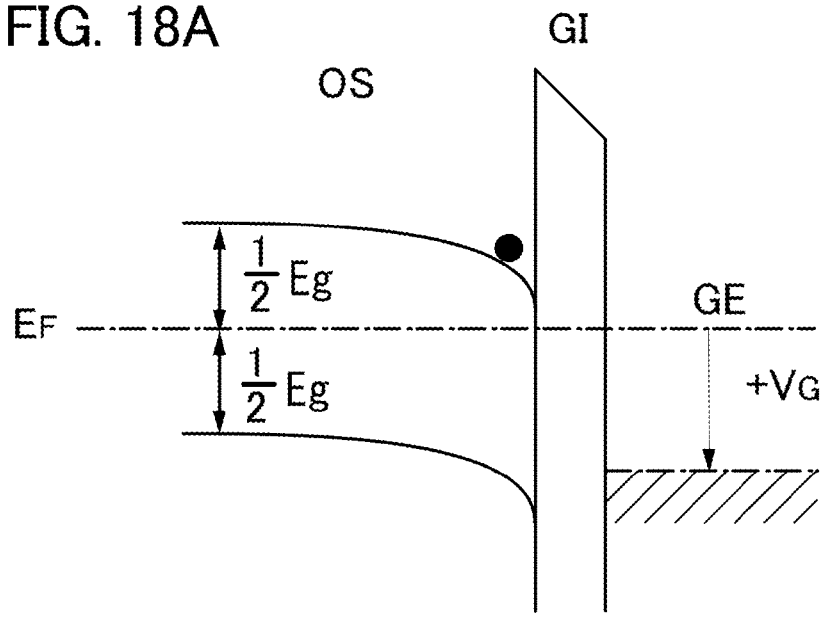
FIGS. 18A and 18B are energy band diagrams of the MOS transistor.

FIG. 18A is an energy band diagram of a MOS transistor using an oxide semiconductor, where the gate voltage is positive. In the drawing, GE represents a gate electrode, GI represents a gate insulating film, and OS represents an oxide semiconductor material. In this case, almost no thermally excited carriers exist in a high-purity oxide semiconductor material. Hence, carriers are not stored also in the vicinity of a gate insulating film. Carriers injected from the source can however propagate as shown in FIG. 17.

Figure 18B:
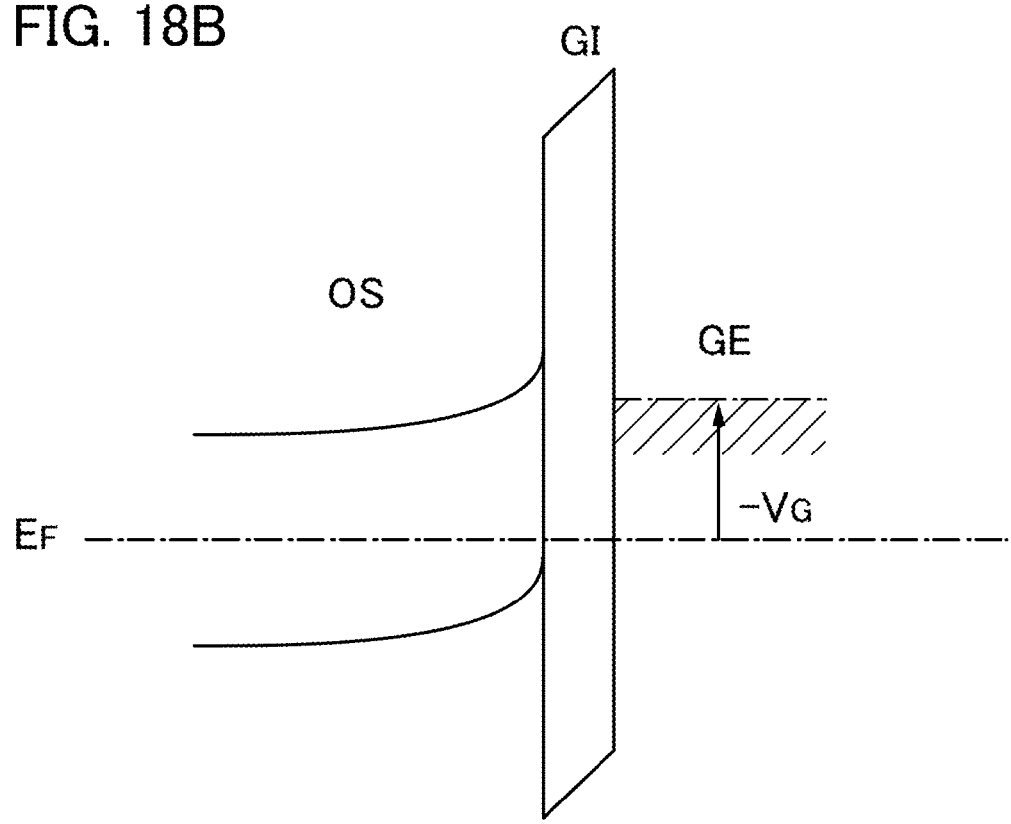

FIG. 18B is an energy band diagram of a MOS transistor using an oxide semiconductor material, where the gate voltage is negative. Since the oxide semiconductor has almost no minority carriers (holes), carriers are not accumulated in the vicinity of the gate insulating film. This indicates that the transistor provides low off-state current.

Figure 19:
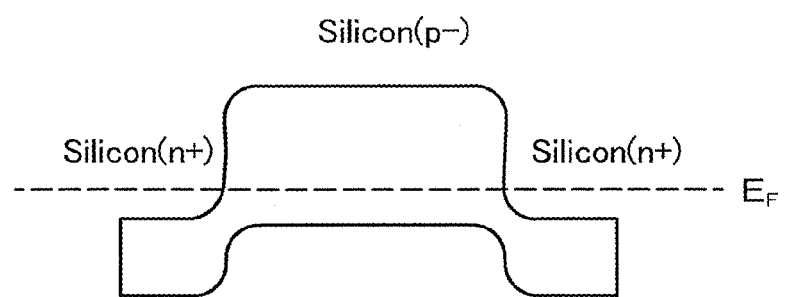
FIG. 19 shows a band structure between a source and a drain of a silicon MOS transistor.

FIG. 19 is a band diagram of a transistor using a silicon semiconductor material. The intrinsic carrier concentration of the silicon semiconductor material is $1.45 \times 10^{10}/cm^3$ (300 K) and carriers exist even at room temperature. This means that thermally excited carriers exist even at room temperature. In practical use, a silicon wafer to which an impurity element such as phosphorus or boron is added is used; therefore, the silicon semiconductor material practically has $1 \times 10^{14}/cm^3$ or more carriers which contribute to conduction between the source and the drain. Further, since the band gap of a silicon semiconductor is 1.12 eV, the off-state current of the transistor using a silicon semiconductor material greatly changes with temperature.

As described above, not only by simply using an oxide semiconductor with a wide band gap for a transistor, but also by reducing impurities providing donors, such as hydrogen, to a very low level so that the carrier density may be less than $1 \times 10^{14}/cm^3$, preferably less than $1 \times 10^{12}/cm^3$, more preferably less than $1 \times 10^{11}/cm^3$, still more preferably less than $6.0 \times 10^{10}/cm^3$, carriers thermally excited at a practical operation temperature can be eliminated, so that a transistor may be operated by only carriers injected from the source. This makes it possible to reduce the off-state current to $1 \times 10^{-13}$ A or less and to obtain a transistor whose off-state current hardly changes with temperature and which is capable of extremely stable operation.

Next, the off-state current values measured by using a test element group (also referred to as a TEG) will be described.

Figure 20:
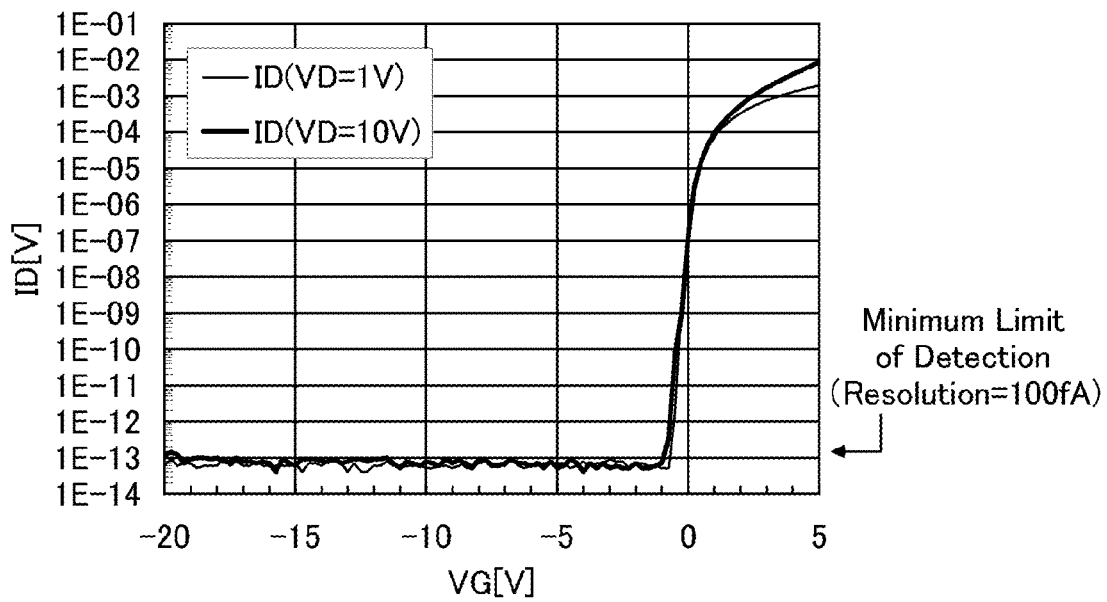
FIG. 20 is a graph showing initial characteristics of a fabricated transistor.
Figure 21A:
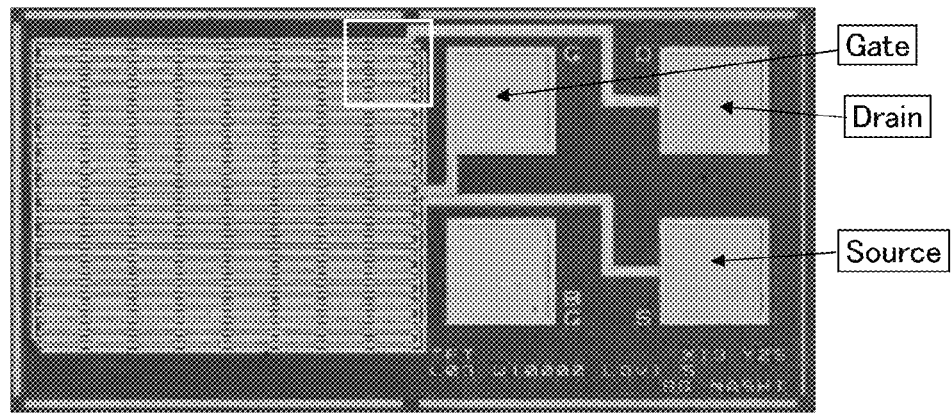
FIGS. 21A and 21B are top views of the fabricated transistor.
Figure 21B:
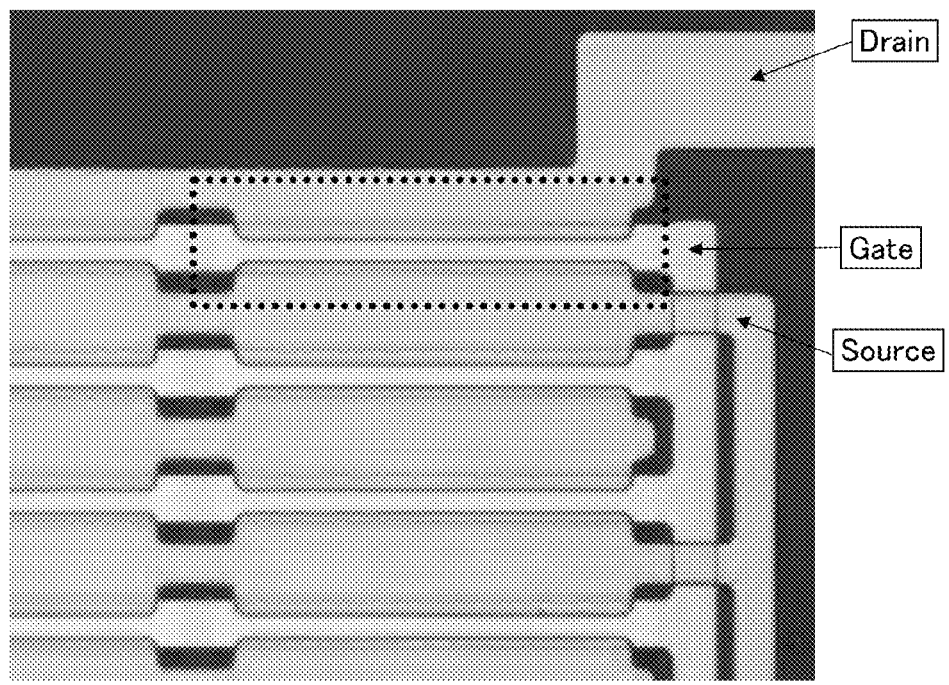

FIG. 20 shows the initial characteristics of a transistor allowed to have L/W=3 μm/10000 μm by connecting in parallel two hundreds transistors each having L/W=3 μm/50 μm. Here, Vg ranges from −20 V to +5 V. A top view is shown in FIG. 21A and a partly enlarged view thereof is show in FIG. 21B. The region enclosed by a dotted line in FIG. 21B is a transistor of one stage having L/W=3 μm/50 μm and Lov=1.5 μm. In order to measure the initial characteristics of the transistor, the characteristics regarding changes in the source-drain current (hereinafter referred to as drain current or Id), i.e. Vg-Id characteristics, were measured under the conditions that the substrate temperature is room temperature, the source-drain voltage (hereinafter referred to as drain voltage or Vd) is 10 V, and the source-gate voltage (hereinafter referred to as gate voltage or Vg) is changed between −20 V and +20 V.

As shown in FIG. 20, the transistor having a channel width W of 10000 μm has off-state current of $1 \times 10^{-13}$ A or less at Vd of 1 V and 10 V, which is less than or equal to the resolution (100 fA) of a measuring instrument (a semiconductor parameter analyzer, Agilent 4156C manufactured by Agilent Technologies Inc.).

Next, a method for fabricating the transistor used for the measurement is described.

First, a silicon nitride layer was formed as a base layer over a glass substrate by CVD, and a silicon oxynitride layer was formed over the silicon nitride layer. Subsequently, a tungsten layer was formed as a gate electrode over the silicon oxynitride layer by sputtering. Then, the tungsten layer was selectively etched into the gate electrode.

Then, a 100-nm-thick silicon oxynitride layer was formed as a gate insulating layer over the gate electrode by CVD.

Then, a 50-nm-thick oxide semiconductor layer was formed over the gate insulating layer by sputtering using an In—Ga—Zn—O-based metal oxide target (at a molar ratio of $In_2O_3$:$Ga_2O_3$:ZnO=1:1:2). Then, the oxide semiconductor layer was selectively etched into an island-shaped oxide semiconductor layer.

Then, the first heat treatment was performed on the oxide semiconductor layer in a nitrogen atmosphere in a clean oven at 450° C. for 1 hour.

Then, a 150-nm-thick titanium layer was formed as a source electrode and a drain electrode over the oxide semiconductor layer by sputtering. At that time, the source electrode and the drain electrode were selectively etched. A transistor having L/W=3 μm/110000 μm is given by connecting in parallel 200 transistors each having a channel length L of 3 μm and a channel width W of 50 μm.

Then, a 300-nm-thick silicon oxide layer was formed as a protective insulating layer so as to be in contact with the oxide semiconductor layer by reactive sputtering. At that time, the silicon oxide layer which is a protective insulating layer was selectively etched, forming openings over the gate electrode, the source electrode, and the drain electrode. Subsequently, the second heat treatment was performed in a nitrogen atmosphere at 250° C. for one hour. Further heat treatment was performed at 150° C. for 10 hours prior to the measurement of Vg-Id characteristics.

A bottom-gate transistor was formed through the above process.

The reason why the off-state current of the transistor is approximately $1 \times 10^{-13}$ A as shown in FIG. 20 is that the hydrogen concentration in the oxide semiconductor layer can be sufficiently reduced in the above fabricating process. The hydrogen concentration in the oxide semiconductor layer is $5 \times 10^{19}$ atoms/$cm^3$ or less, preferably $5 \times 10^{18}$ atoms/$cm^3$ or less, more preferably $5 \times 10^{17}$ atoms/$cm^3$ or less, still more preferably less than $1 \times 10^{16}$ atoms/$cm^3$. Note that the hydrogen concentration in the oxide semiconductor layer is measured by secondary ion mass spectrometry (SIMS).

Note that although in this measurement an In—Ga—Zn—O based oxide semiconductor material is used, the present invention is not limited to this. For example, an In—Sn—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, an In—Sn—O-based oxide semiconductor material, a Sn—Zn—O-based oxide semiconductor material, an Al—Zn—O-based oxide semiconductor material, an In—O-based oxide semiconductor material, a Sn—O-based oxide semiconductor material, or a Zn—O-based oxide semiconductor material, can alternatively be used. Alternatively, an In—Al—Zn—O-based oxide semiconductor material to which $AlO_x$ is added at 2.5 to 10 wt % or an In—Zn—O-based oxide semiconductor material to which $SiO_x$ is added at 2.5 to 10 wt % can be used.

There is no particular limitation on the crystallinity of the oxide semiconductor material. Specifically, an amorphous one, a microcrystalline (also referred to as semi-amorphous) one, a polycrystalline one, and a single crystal one are each can be used, and amorphous one is preferable because the use of an oxide semiconductor material having an amorphous portion is particularly effective in reducing the off-state current of the modulation circuit.

The carrier concentration in the oxide semiconductor layer, which is measured by a carrier measuring system, is less than $1\times10^{14}/cm^3$, preferably less than $1\times10^{12}/cm^3$, more preferably less than $1\times10^{11}/cm^3$, still more preferably less than $6.0\times10^{10}/cm^3$. In other words, the carrier concentration in the oxide semiconductor layer can be extremely close to zero. Note that to measure the carrier concentration, a MOS capacitor is fabricated and the results of the CV measurement (CV characteristics) of the MOS capacitor are evaluated, for example.

The channel length L of a transistor can range from 10 to 1000 nm. In this case, the operating speed of a circuit can be increased. In addition, power consumption can be reduced because the off-state current is extremely low.

Note that, in circuit design, the oxide semiconductor layer can be regarded as an insulator when the transistor is in the off state.

Then, the temperature characteristics of the off-state current of the transistor fabricated in this embodiment were evaluated. Temperature characteristics are important in considering the environmental resistance, maintenance of performance, or the like of an end product including a transistor. Naturally, the smaller the variations in off-state current in respect to the temperature are, the more preferable it is. This is because the smaller the variations in off-state current in respect to the temperature are, the more flexibility in the product design is given.

For the temperature characteristics, the Vg-Id characteristics were obtained using a constant-temperature chamber under the conditions that substrates provided with transistors were kept at respective constant temperatures of –30° C., 0° C., 25° C., 40° C., 60° C., 80° C., 100° C., and 120° C.; the drain voltage was 6 V; and the gate voltage was changed between –20 V and +20V.

Figure 22A:
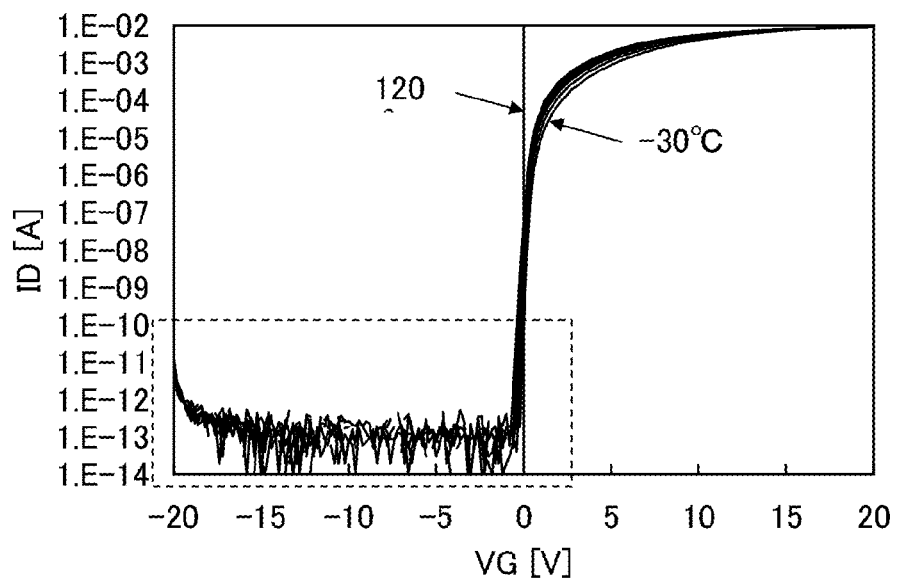
FIGS. 22A and 22B are graphs showing electric characteristics of the fabricated transistor.
Figure 22B:
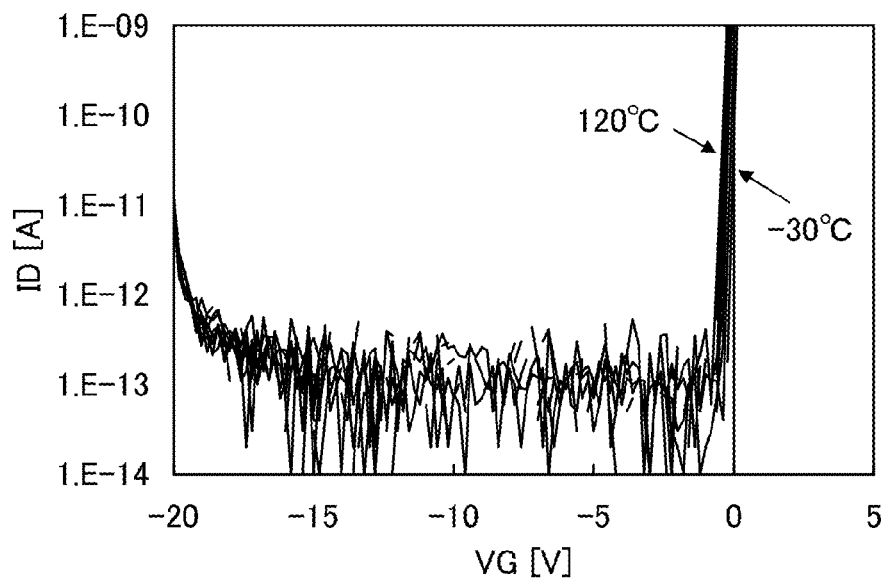

FIG. 22A is a graph showing Vg-Id characteristics measured at the above temperatures, and FIG. 22B shows an enlarged view of the dotted portion in FIG. 22A. The rightmost curve indicated by an arrow in the graph is a curve obtained at –30° C.; the leftmost curve is a curve obtained at 120° C.; and curves obtained at the other temperatures are located therebetween. The temperature dependence of on-state current can hardly be observed. On the other hand, as is shown in the enlarged view of FIG. 22B, the off-state current is $1\times10^{-12}$ A or less, which is near the resolution of the measuring instrument, at all the temperatures as long as the gate voltage is not around –20 V, and the temperature dependence of the off-state current is not observed. In other words, even at a high temperature of 120° C., the off-state current is kept at $1\times10^{-12}$ A or less. Considering the channel width W is 10000 μm, the off-state current is $1\times10^{-16}$ A/μm, which is extremely low.

A transistor using a high-purity oxide semiconductor (purified oxide semiconductor) shows almost no temperature dependence of off-state current. This results from the fact that the oxide semiconductor has an energy gap of 3 eV or more and has very few thermally excited carriers, and the fact that the source region and the drain region are in a degenerated state. Most of the operations of a transistor are caused by carriers injected from the degenerated source region into the oxide semiconductor material, and the carrier density is independent of temperature. This is why the above characteristics (the off-state current independent of temperature) appear.

As described above, although the transistor has a channel width W of $1\times10^4$ μm and a channel length of 3 μm, the transistor has excellent electric characteristics: the off-state current is $10^{-13}$ A or less, and the subthreshold swing (S value) is 0.1 V/dec. (the thickness of the gate insulating film is 100 nm). By preventing, to the extent possible, the oxide semiconductor material from containing impurities and thus making the oxide semiconductor material of high purity, favorable operation of the transistor can be obtained.

As described above, in this embodiment, the off-state current can be reduced to $1\times10^{-13}$ A or less, preferably $1\times10^{-16}$ A or less, by employing a transistor using a high-purity oxide semiconductor material as the transistor 303. The resistance of the transistor 303 being in the off state can thus be increased without limit. This leads to more stable operation of the modulation circuit 301. In addition, the low off-state current of the transistor 303 reduces excessive power consumption of the modulation circuit.

Embodiment 3

In this embodiment, a configuration whereby the power consumption of the modulation circuit is further reduced will be described.

Figure 7:
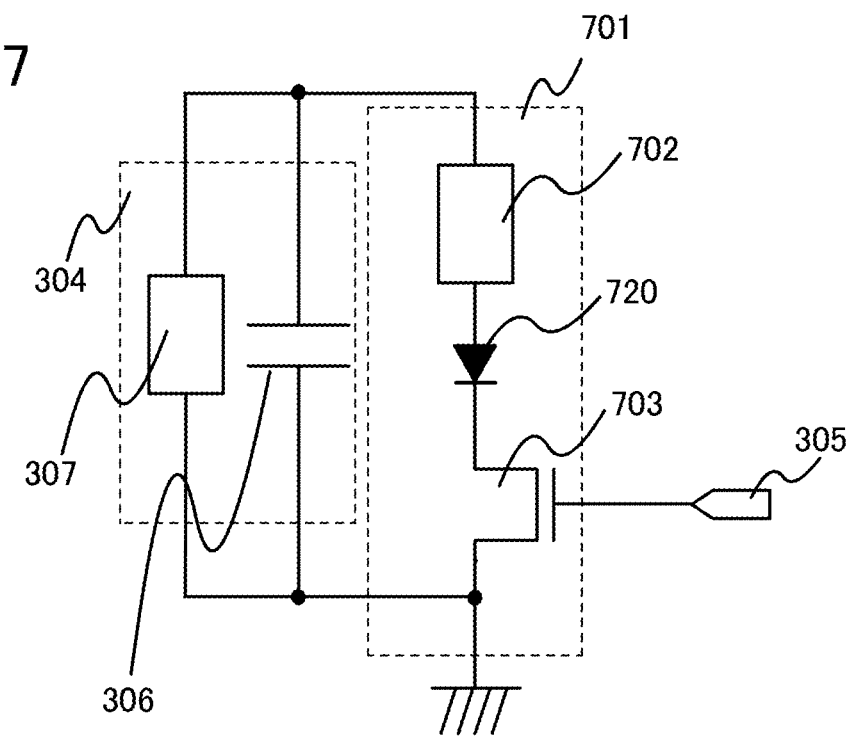
FIG. 7 is a circuit diagram showing an example of a modulation circuit.

First, one example of the configuration of the modulation circuit of this embodiment will be described with reference to FIG. 7. FIG. 7 is different from FIG. 3 described in Embodiment 1 in that a modulation circuit 701 shown in FIG. 7 has a load 702, a transistor 703, and a diode 720 which are connected in series between the two terminals of the antenna 304, while the modulation circuit 301 shown in FIG. 3 has the load 302 and the transistor 303 are connected in series between the two terminals of the antenna 304. In other words, the modulation circuit 701 shown in FIG. 7 includes the load 702, the transistor 703, and the diode 720. One terminal of the load 702 is electrically connected to one terminal of the antenna 304, and the other terminal of the load 702 is electrically connected to the anode (one terminal) of the diode 720. The cathode (the other terminal) of the diode 720 is electrically connected to one of the source and drain of the transistor 703. The other of the source and drain of the transistor 703 is electrically connected to the other terminal of the antenna 304. The signal 305 inputted to the gate of the transistor 703 controls the on/off of the transistor 703.

There is no particular limitation on the type of the diode 720; a PN diode, a PIN diode, a Schottky barrier diode, a constant voltage diode (a zener diode), a diode-connected transistor, or the like can be used as long as a rectification effect can be obtained. For example, it is possible to use an n-channel transistor of which a gate and one of the source and drain are diode-connected. Alternatively, a p-channel transistor of which a gate and one of the source and drain are diode-connected can be used. It is also possible to use a transistor group including a plurality of diode-connected transistors connected in series (hereinafter referred to as a diode-connected transistor group). In the case of using a PN diode or a PIN diode, a lateral junction PN diode or PIN diode is preferably used. This is because a lateral junction PN diode or a lateral junction PIN diode can be formed over the same substrate as transistors needed for a semiconductor device such as an RF tag without changing the existing process. These various types of diodes can be used as appropriate not only for the diode 720 but also for the other diodes used in one embodiment of the present invention.

Note that the diode 720 is an element which can function as a load, but in this embodiment, the load 702 and the diode 720 are regarded as elements different from each other. Therefore, the load 702 of this embodiment is an element other than a diode. Specifically, the load 702 can be a capacitor, a resistor, or the combination of a capacitor and a resistor mentioned in Embodiment 1.

Next, the operation of the modulation circuit of this embodiment will be described. The transistor 703 becomes on (conducting) or off (non-conducting) in response to a signal (also referred to as a sub-carrier wave) from a logic circuit. An example of the method for modulating the signal 305 from the logic circuit is ASK (amplitude shift keying) in which the amplitude of a carrier wave is varied.

Note that as described above, although there is no limitation on the conductivity type of the transistor 703, this embodiment describes the case where an n-channel transistor whose channel formation region is formed using a high-purity semiconductor material is used. In the following description, one terminal of the antenna refers to a terminal connected to the load 702, and the other terminal of the antenna refers to a terminal connected to the other of the source and drain of the transistor 703. Note that, as described above, the antenna described in this specification is a balanced device; therefore, a sine wave with a certain frequency is inputted to each of the two terminals of the antenna. A signal at one terminal of the antenna and a signal at the other terminal of the antenna are 180° out of phase with each other. However, in order to briefly describe the circuit, the potential of the other terminal of the antenna is regarded as a fixed potential (0 V).

First, a period in which the potential of one terminal of the antenna 304 is positive will be explained. In the period in which the potential of one terminal of the antenna 304 is positive, the source of the transistor 703 is connected to the other terminal of the antenna 304, and the drain of the transistor 703 is connected to the cathode of the diode 720. Consequently, the potential of the source of the transistor 703 becomes 0 V. If the signal 305 inputted from the logic circuit to the gate of the transistor 703 at that time is low, the transistor 703 is in the off state. In this embodiment, an n-channel transistor whose channel formation region is formed using a high-purity oxide semiconductor material is employed and its off-state current is extremely low. Hence, current flowing to the other terminal of the antenna 304 from one terminal of the antenna 304 via the modulation circuit 701 can be regarded as approximately zero, so that there is almost no change in the impedance between the two terminals of the antenna 304b. This enables the modulation circuit 701 to operate in an ideal way. On the other hand, when the signal 305 inputted from the logic circuit to the gate of the transistor 703 is high, the transistor 703 is turned on, and forward current flows from one terminal of the antenna 304 to the other terminal of the antenna 304 via the modulation circuit 701. This flow of forward current changes the potential of one terminal of the antenna 304, so that the impedance between the two terminals of the antenna 304 is changed. In this embodiment, an n-channel transistor including a high-purity oxide semiconductor material is employed, thereby improving the reliability of the operation of the modulation circuit and reducing excessive power consumption.

Next, a period in which the potential of one terminal of the antenna 304 is negative will be explained. In the period in which the potential of one terminal of the antenna 304 is negative, the drain of the transistor 703 is connected to the other terminal of the antenna 304, and the source of the transistor 703 is connected to the cathode of the diode 720. Consequently, the potential of the source of the transistor 703 becomes negative. Therefore, even when the signal 305 inputted from the logic circuit to the gate of the transistor 703 is low, the potential of the source of the transistor 703 is lower than that of the gate of the transistor 703, so that the transistor 703 is turned on. Also when the signal 305 inputted from the logic circuit to the gate of the transistor 703 is high, the transistor 703 is in the on state. Consequently, during the period in which the potential of one terminal of the antenna 304 is negative, the transistor 703 is in the on state all the time regardless of the signal 305 inputted from the logic circuit to the gate of the transistor 703. Consequently, the modulation circuit has difficulty in operating properly. The diode 720 is therefore placed between the load 702 and the transistor 703 in this embodiment, thereby preventing occurrence of reverse current in a period in which the potential of one terminal of the antenna 304 is negative, and reducing excessive power consumption of the modulation circuit.

In addition, the RF tag can operate with lower power consumption than conventional one because the reverse current of the modulation circuit 701 is reduced by providing the diode 720, which results in an increase in the maximum communication distance of the RF tag. The reason can be explained as follows.

As shown in FIG. 1 described in Embodiment 1, the antenna circuit 102 is electrically connected to the demodulation circuit 103 and the rectifier circuit 113 in addition to the modulation circuit 104. Consequently, as the reverse current of the modulation circuit 104 is reduced, the amount of current supplied to the demodulation circuit 103 and the rectifier circuit 113 increases according to the amount of the reduction of the reverse current. When the amount of current supplied to the rectifier circuit 113 increases, the amount of DC voltage generated by the rectifier circuit 113 also increases. Therefore, the RF tag 100 can operate even when the power supplied from the reader/writer via the antenna circuit 102 is smaller than that in conventional one. Thus, the amount of power needed for the operation of the RF tag 100 can be reduced as compared to that in a conventional RF tag, resulting in an increase in the maximum communication distance of the RF tag 100.

Figure 8:
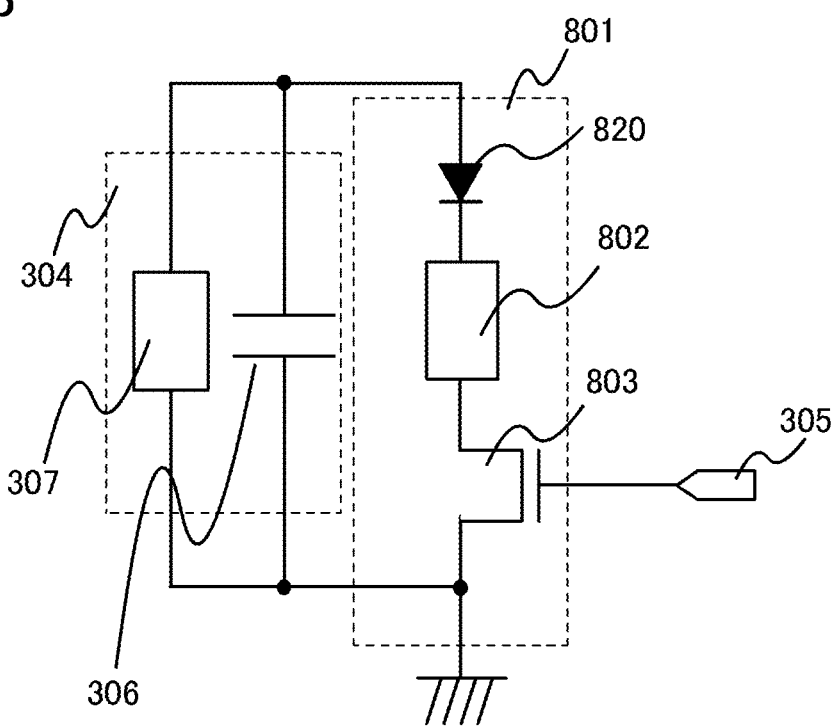
FIG. 8 is a circuit diagram showing an example of a modulation circuit.
Figure 9:
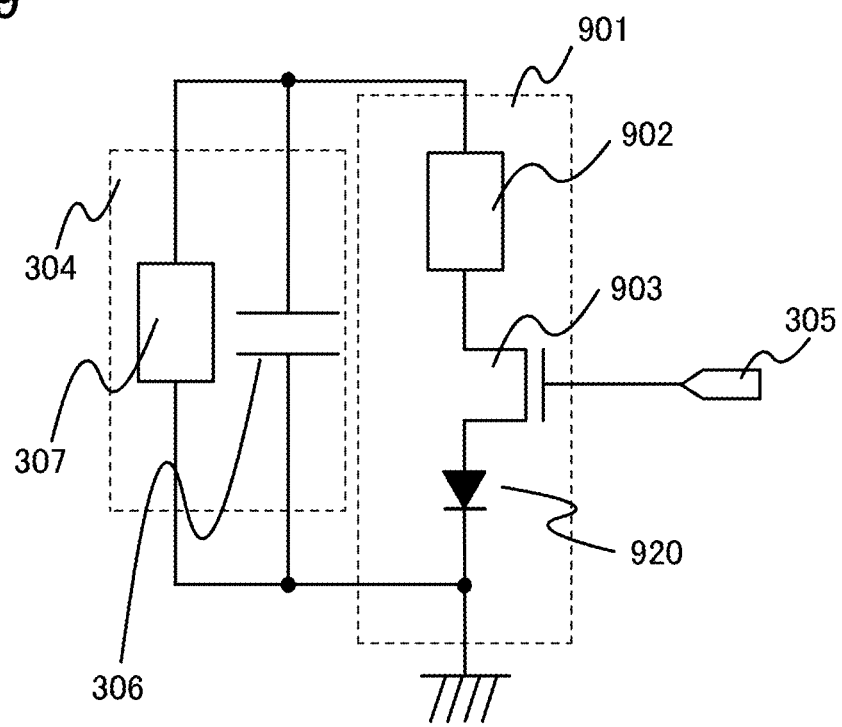
FIG. 9 is a circuit diagram showing an example of a modulation circuit.
Figure 10A:
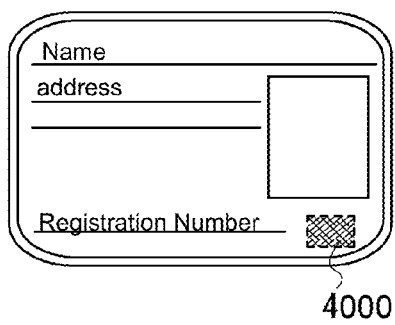
FIGS. 10A to 10F are diagrams showing examples of the use of an RF tag.
Figure 10B:
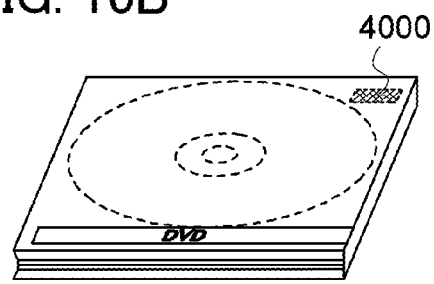
Figure 10C:
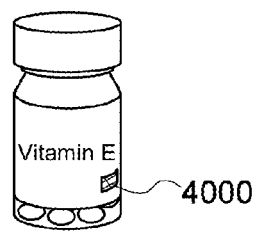
Figure 10D:
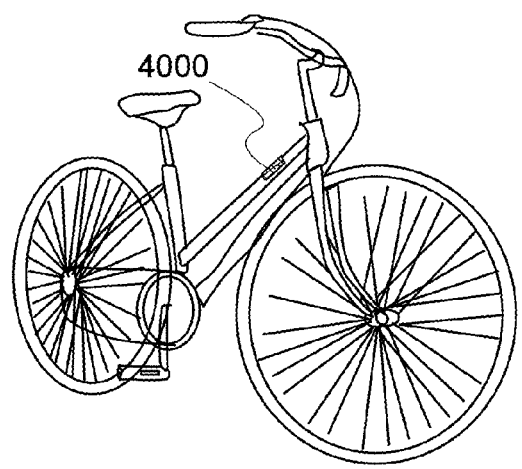
Figure 10E:
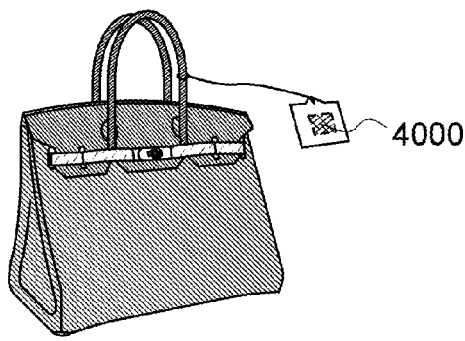
Figure 10F:
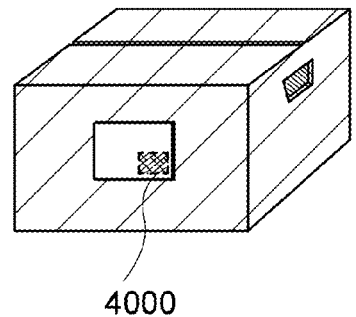

Note that one embodiment of the present invention is not limited to connections between the load 702, the diode 720, and the transistor 703 shown in FIG. 7. Specifically, in one embodiment of the present invention, a load, a diode, and a switch antenna are connected in series between the two terminals of the antenna. The load, the diode, and the switch are connected in series in no particular order. For example, even in the case where, as in a modulation circuit 801 shown in FIG. 8, the anode of a diode 820 is electrically connected to one terminal of the antenna 304, the cathode of the diode 820 is electrically connected to one of the source and drain of a transistor 803 through the load 802, and the other of the source and drain of the transistor 803 is electrically connected to the other terminal of the antenna 304, it is possible to improve reliability of the operation of the modulation circuit and to reduce excessive power consumption. In addition, even in the case where, as in a modulation circuit 901 shown in FIG. 9, one of the source and drain of a transistor 903 is electrically connected to one terminal of the antenna 304 through a load 902, the other of the source and drain of the transistor 903 is electrically connected to the anode of the diode 920, and the cathode of the diode 920 is electrically connected to the other terminal of the antenna 304, it is possible to improve reliability in the operation of the modulation circuit and to reduce excessive power consumption.

Embodiment 4

In this embodiment, a structural example of the transistor used in a modulation circuit and an example of the fabricating method thereof will be described. In other words, a structural example of a transistor using a high-purity oxide semiconductor and an example of the fabricating method thereof will be described.

Figure 11A:
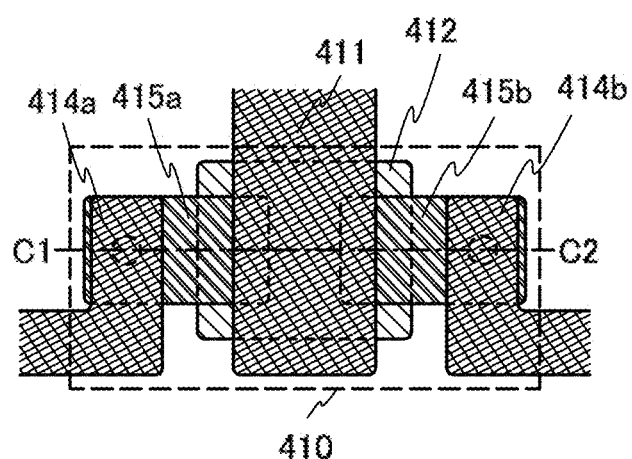
FIGS. 11A and 11B are a plan view and a cross-sectional view showing an example of a transistor.
Figure 11B:
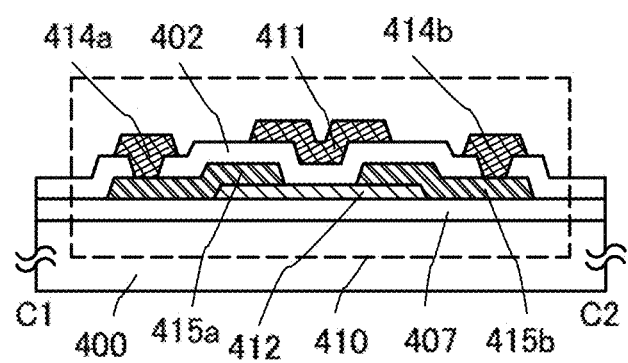

First, FIGS. 11A and 11B show an example of the planar structure and the cross-sectional structure of a transistor. FIG. 11A is a plan view of a transistor 410 having a top-gate structure and FIG. 11B is a cross-sectional view showing section C1-C2 in FIG. 11A.

The transistor 410 includes, over a substrate 400, an insulating layer 407, an oxide semiconductor layer 412, a first electrode (one of the source electrode and drain electrode) 415a, a second electrode (the other of the source electrode and the drain electrode) 415b, a gate insulating layer 402, and a gate electrode 411. A first wiring 414a and a second wiring 414b are provided so as to be in contact with and electrically connected to the first electrode 415a and the second electrode 415b, respectively.

Note that although the transistor 410 in FIG. 11A is a single-gate transistor, the present invention is not limited to this configuration. The transistor can be a multi-gate transistor including a plurality of gate electrodes and a plurality of channel formation regions.

Next, the fabricating process of the transistor 410 will be described with reference to FIGS. 12A to 12E.

First, an insulating layer 407 serving as a base film is formed over the substrate 400.

Although there is no particular limitation on a substrate that can be used as the substrate 400, the substrate needs to have heat resistance high enough to withstand at least heat treatment performed later. In the case where the temperature of the heat treatment performed later is high, a substrate having a strain point of 730° C. or higher is preferably used. Specific examples of the substrate 400 include a glass substrate, a crystalline glass substrate, a ceramic substrate, a quartz substrate, a sapphire substrate, and a plastic substrate. Further, specific examples of the material for the glass substrate include aluminosilicate glass, aluminoborosilicate glass, and barium borosilicate glass.

The insulating layer 407 is preferably an oxide insulating layer such as a silicon oxide layer, a silicon oxynitride layer, an aluminum oxide layer, or an aluminum oxynitride layer. The insulating layer 407 can be formed by plasma CVD, sputtering, or the like. In order to prevent the insulating layer 407 from containing a large amount of hydrogen, the insulating layer 407 is preferably formed by sputtering. In this embodiment, a silicon oxide layer is formed as the insulating layer 407 by sputtering. Specifically, the substrate 400 is transferred to a process chamber and a sputtering gas which contains high-purity oxygen and from which hydrogen and moisture have been removed is introduced, and a target of silicon or silicon oxide is used, thus forming a silicon oxide layer as the insulating layer 407 over the substrate 400. Note that the substrate 400 can be kept at room temperature or can be heated during deposition.

A specific example of the deposition condition for depositing a silicon oxide film is as follows: quartz (preferably, synthetic quartz) is used as the target; the substrate temperature is 108° C.; the distance between a target and the substrate 400 (T-S distance) is 60 mm; the pressure is 0.4 Pa; the high-frequency power is 1.5 kW; the atmosphere is oxygen and argon (the flow rate ratio of oxygen to argon is 25 sccm:25 sccm=1:1); and an RF sputtering method is used. The thickness of the film is 100 nm. Note that a silicon target can be used as the target instead of the quartz (preferably, synthetic quartz) target. Further, an oxygen gas can be used as a sputtering gas instead of a mixed gas of oxygen and argon. Here, a sputtering gas for forming the insulating layer 407 is a high-purity gas in which the concentration of impurities such as hydrogen, water, hydroxyl, or hydride is reduced to the extent that it is in parts per million, and preferably in parts per billion.

Further, it is preferable that the insulating layer 407 be formed while moisture remaining in the process chamber is removed so that the insulating layer 407 may be prevented from containing hydrogen, hydroxyl, or moisture.

In order to remove moisture remaining in the process chamber, a sorption vacuum pump is used. For example, a cryopump, an ion pump, or a titanium sublimation pump can be used. Further, as an evacuation means, a turbo pump provided with a cold trap is preferable. A deposition chamber which is evacuated with a cryopump is preferable because hydrogen atoms, compounds including a hydrogen atom such as water ($H_2O$), or the like are exhausted from the deposition chamber and hydrogen atoms are thus hardly included in the insulating layer 407 deposited in the deposition chamber.

Examples of the sputtering include an RF sputtering in which a high-frequency power source is used for a sputtering power supply, DC sputtering, and pulsed DC sputtering in which a bias is applied in a pulsed manner. RF sputtering is mainly used in the case where an insulating film is deposited, and DC sputtering is mainly used in the case where a metal film is deposited.

In addition, a multi-source sputtering apparatus in which a plurality of targets of different materials can be set can be used. With the multi-source sputtering apparatus, films of different materials can be deposited in the same chamber so as to be layered, or a film can be formed by electric discharge of plural kinds of materials at the same time in the same chamber.

Further, a sputtering apparatus provided with a magnet system inside the chamber and used for magnetron sputtering, or a sputtering apparatus used for ECR sputtering in which plasma generated with the use of microwaves is used without using glow discharge can be used.

Further, examples of the deposition method using sputtering include reactive sputtering in which a target substance and a sputtering gas component are chemically reacted with each other during the deposition to form a thin compound film thereof, and bias sputtering in which voltage is also applied to a substrate during the deposition.

The insulating layer 407 can be either a single layer or a multilayer. For example, the insulating layer 407 can be a multilayer including a nitride insulating layer such as a silicon nitride layer, a silicon nitride oxide layer, an aluminum nitride layer, or an aluminum nitride oxide layer and the above oxide insulating layer are stacked in this order over the substrate 400.

For example, a sputtering gas containing high-purity nitrogen from which hydrogen and moisture have been removed is introduced between the silicon oxide layer and the substrate and a silicon nitride layer is deposited using a silicon target. In this step also, it is preferable that the silicon nitride layer be deposited while moisture remaining in the process chamber is removed as in the case of the silicon oxide layer. In the deposition of the silicon nitride layer, a substrate may also be heated during the deposition.

In the case where the stack of a silicon nitride layer and a silicon oxide layer is provided as the insulating layer 407, the silicon nitride layer and the silicon oxide layer can be formed in the same process chamber using the same silicon target. First, a sputtering gas including nitrogen is introduced and a silicon nitride layer is formed using a silicon target provided in the process chamber, and then the sputtering gas is switched to a sputtering gas including oxygen to form a silicon oxide layer using the same silicon target. Since the silicon nitride layer and the silicon oxide layer can be formed in succession without exposure to air in this method, impurities such as hydrogen or moisture can be prevented from being adsorbed on a surface of the silicon nitride layer.

Then, an oxide semiconductor layer is formed over the insulating layer 407 by sputtering.

Further, in order that hydrogen, hydroxyl, and moisture may be contained in the oxide semiconductor layer as little as possible, it is preferable that the substrate 400 over which the insulating layer 407 is formed be preheated in a preheating chamber of a sputtering apparatus as pretreatment for the film deposition so that impurities such as hydrogen and moisture adsorbed to the substrate 400 may be evacuated from the chamber. Note that as an evacuation means, a cryopump is preferably provided in the preheating chamber. Further, this preheating can be performed on the substrate 400 prior to the deposition of the gate insulating layer 402 formed later. Further, this preheating is preferably performed similarly on the substrate 400 over which layers up to the first electrode 415a and the second electrode 415b are formed. Note that this preheating treatment can be omitted.

Note that before the oxide semiconductor layer is formed by sputtering, dust attached to a surface of the insulating layer 407 is preferably removed by reverse sputtering in which an argon gas is introduced and plasma is generated. The reverse sputtering refers to a method in which, without application of voltage to a target, a high-frequency power source is used for application of voltage to a substrate in an argon atmosphere in order to generate plasma in the vicinity of the substrate to modify a surface. Note that instead of an argon atmosphere, nitrogen atmosphere, helium atmosphere, oxygen atmosphere, or the like can be used.

As a target for forming the oxide semiconductor layer, a metal oxide target whose main component is zinc oxide can be used. Another example of an applicable metal oxide target is a metal oxide target containing In, Ga, and Zn (with a composition ratio of $In_2O_3:Ga_2O_3:ZnO=1:1:1$ [mol %] or In:Ga:Zn=1:1:0.5 [atom %]). Alternatively, as the metal oxide target containing In, Ga, and Zn, a target having a composition ratio of In:Ga:Zn=1:1:1 [atomic %] or a target having a composition ratio of In:Ga:Zn=1:1:2 [atomic %] can be used. Further, a target which contains $SiO_2$ at 2 to 10 wt % can be used. The filling factor of the metal oxide target is 90 to 100%, and preferably 95 to 99.9%. The use of a metal oxide target with a high filling factor enables the formed oxide semiconductor layer to have high density.

Note that the oxide semiconductor layer can be formed in a rare gas (typically, argon) atmosphere, an oxygen atmosphere, or an atmosphere of a rare gas (typically, argon) and oxygen. Here, a sputtering gas for forming the oxide semiconductor layer is a high-purity gas in which the concentration of impurities such as hydrogen, water, hydroxyl, or hydride is reduced to the extent that it is in parts per million, and preferably in parts per billion.

The oxide semiconductor layer is formed over the substrate 400 in such a manner that the substrate is held in a process chamber maintained at reduced pressure, a sputtering gas from which hydrogen and moisture have been removed is introduced while moisture remaining in the process chamber is removed, and metal oxide is used as a target. In order to remove moisture remaining in the process chamber, a sorption vacuum pump is preferably used. For example, a cryopump, an ion pump, or a titanium sublimation pump is preferably used. In a deposition chamber which is evacuated with a cryopump, hydrogen atoms, compounds including hydrogen atoms such as water ($H_2O$) (more preferably, compounds including carbon atoms in addition), and the like are exhausted. Consequently, the concentration of impurities contained in the oxide semiconductor layer deposited in the deposition chamber can be reduced. Further, the substrate temperature can be kept at room temperature or can be increased to a temperature less than 400° C. during the deposition of the oxide semiconductor layer.

As an example of the deposition condition of the oxide semiconductor layer, the following condition can be given: the temperature of the substrate is room temperature; the distance between the substrate and the target is 110 mm; the pressure is 0.4 Pa; the direct current (DC) power supply is 0.5 kW; and the atmosphere is oxygen and argon (the flow rate ratio of oxygen to argon is 15 sccm:30 sccm). Note that a pulse direct current (DC) power supply is preferable because dust is reduced and the film thickness can be made uniform. The thickness of the oxide semiconductor layer is preferably 2 to 200 nm, preferably 5 to 30 nm. Note that an appropriate thickness of the oxide semiconductor layer varies depending on the material used therefor, and the thickness is thus determined as appropriate depending on the material.

Specific examples of the oxide semiconductor layer formed by the above method can be an In—Sn—Ga—Zn—O layer that is a quaternary metal oxide; an In—Ga—Zn—O layer, an In—Sn—Zn—O layer, In—Al—Zn—O layer, an Sn—Ga—Zn—O layer, an Al—Ga—Zn—O layer, or an Sn—Al—Zn—O layer that is a ternary metal oxide; an In—Zn—O layer, an Sn—Zn—O layer, an Al—Zn—O layer, a Zn—Mg—O layer, an Sn—Mg—O layer, or an In—Mg—O layer that is a binary metal oxide; an In—O layer; an Sn—O layer; a Zn—O layer; and the like. These oxide semiconductor layers can contain $SiO_2$. These oxide semiconductor layers can be amorphous or crystalline. Further, these oxide semiconductor layers can be non-single-crystal or single crystal. In this embodiment a non-single-crystal In—Ga—Zn—O film is formed by sputtering using In—Ga—Zn—O as a target.

Note that as the oxide semiconductor layer, a thin film expressed by $InMO_3(ZnO)_m$ (m>0) can be used. Here, M represents one or more metal elements selected from Ga, Al, Mn, and Co. For example, Ga, Ga and Al, Ga and Mn, or Ga and Co can be given as M. Among the oxide semiconductor films whose composition formulas are represented by $InMO_3(ZnO)_m$ (m>0), an oxide semiconductor which contains Ga as M is referred to as an In—Ga—Zn—O oxide semiconductor, which is given above.

Figure 12A:
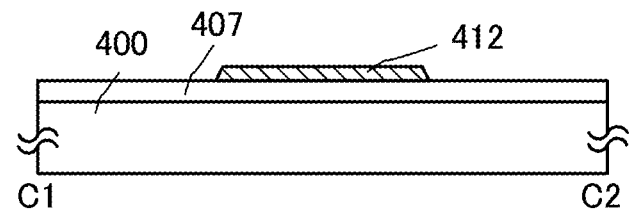
FIGS. 12A to 12E are cross-sectional views showing an example of a method for manufacturing a transistor.
Figure 12B:
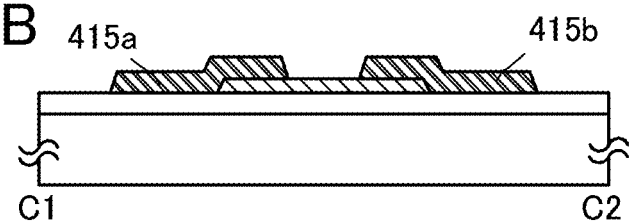

Then, an oxide semiconductor layer is processed into an island-shaped oxide semiconductor layer 412 in the first photolithography process (see FIG. 12A). Note that a resist mask for forming the island-shaped oxide semiconductor layer 412 may be formed using the inkjet method. The formation of the resist mask by the inkjet method does not use a photomask; thus, manufacturing cost can be reduced.

Note that the etching of the oxide semiconductor layer can be dry etching, wet etching, or both wet etching and dry etching.

In the case of dry etching, a parallel plate reactive ion etching (RIE) method or an inductively coupled plasma (ICP) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

The etching gas for dry etching is preferably a gas including chlorine (a chlorine-based gas such as chlorine ($Cl_2$), boron trichloride ($BCl_3$), silicon tetrachloride ($SiCl_4$), or carbon tetrachloride ($CCl_4$)) but can alternatively be a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

The etchant used for wet etching can be a mixed solution of phosphoric acid, acetic acid, and nitric acid, or an ammonium hydrogen peroxide mixture (a solution in which 31 wt % hydrogen peroxide, 28 wt % ammonia water, and water are mixed in a volume ratio of 5:2:2), or the like. The etchant used for wet etching can alternatively be ITO-07N (produced by KANTO CHEMICAL CO., INC.). The etching conditions (e.g., an etchant, an etching period, and a temperature) are adjusted as appropriate in accordance with the material for the oxide semiconductor.

In the case of wet etching, an etchant is removed together with the material which is etched off by cleaning. The waste liquid containing the etchant and the material which is etched off may be purified and the material can be reused. When a material (e.g., a rare metal such as indium) contained in the oxide semiconductor layer is collected from the waste liquid after the etching and reused, the resources can be efficiently used.

In this embodiment, the oxide semiconductor layer is processed into the island-shaped oxide semiconductor layer 412 by wet etching using a mixed solution of phosphoric acid, acetic acid, and nitric acid as an etchant.

Then, the first heat treatment is performed on the oxide semiconductor layer 412. The temperature of the first heat treatment is between 400 to 750° C., preferably 400° C. or higher and lower than the strain point of the substrate. Here, the substrate is put in an electric furnace which is a sort of heat treatment apparatus and heat treatment is performed on the oxide semiconductor layer in a nitrogen atmosphere at 450° C. for one hour. After that, the oxide semiconductor layer is prevented from being exposed to air and from containing water or hydrogen again. Thus, the oxide semiconductor layer is obtained. By this first heat treatment, hydrogen, water, hydroxyl, and the like can be removed from the oxide semiconductor layer 412.

Note that the heat treatment apparatus is not limited to an electric furnace, and an apparatus can be provided with a device for heating an object by heat conduction or thermal radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. The gas can be an inert gas (typically, a rare gas such as argon) or a nitrogen gas.

For example, the first heat treatment can employ GRTA, in which the substrate is transferred into an inert gas heated to a high temperature of 650 to 700° C., and heated for several minutes there, and then the substrate is transferred out of the inert gas heated to a high temperature. GRTA enables short-time high-temperature heat treatment.

In the first heat treatment, it is preferable that water, hydrogen, and the like be not contained in the atmosphere. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or less, and preferably 0.1 ppm or less).

Note that depending on the conditions of the first heat treatment or a material of the oxide semiconductor layer, the oxide semiconductor layer 412 may be crystallized to be microcrystalline or a polycrystalline. For example, the oxide semiconductor layer may become a microcrystalline oxide semiconductor layer having a crystallinity of 80% or more. Note that, the island-shaped oxide semiconductor layer 412 may become an amorphous oxide semiconductor layer, being not crystallized by the first heat treatment. The island-shaped oxide semiconductor layer 412 may become an amorphous oxide semiconductor layer in which a microcrystalline portion is mixed (with a grain diameter of 1 nm to 20 nm inclusive, typically 2 nm to 4 nm inclusive).

The first heat treatment performed on the oxide semiconductor layer can be performed on the oxide semiconductor layer not yet been processed into the island-shaped oxide semiconductor layer. In this case, the substrate is taken out from the heat treatment apparatus after the first heat treatment and then subjected to a photolithography process.

Although the first heat treatment is performed mainly for the purpose of removing impurities such as hydrogen, water, and hydroxyl from the oxide semiconductor layer, it may generate oxygen defects in the oxide semiconductor layer. The first heat treatment is therefore preferably performed after excessive oxidation treatment. Specifically, heat treatment in oxygen atmosphere or an atmosphere including nitrogen and oxygen (nitrogen to oxygen is 4 to 1 in volume ratio) may be performed as the excessive oxidation treatment after the first heat treatment, for example. Plasma treatment in an oxygen atmosphere can alternatively be employed.

The heat treatment that is effective in dehydrating or dehydrogenating the oxide semiconductor layer can be performed at any of the following timings: after the oxide semiconductor layer is formed; after a source electrode and a drain electrode are formed over the oxide semiconductor layer; and after a gate insulating layer is formed over the source electrode and the drain electrode.

Then, a conductive film is formed over the insulating layer 407 and the oxide semiconductor layer 412. The conductive film may be formed by sputtering or vacuum evaporation. Examples of the material for the conductive film include a metal material such as Al, Cu, Cr, Ta, Ti, Mo, W, or Y; an alloy material including any of the metal materials; and a conductive metal oxide. Examples of the conductive metal oxide include indium oxide ($In_2O_3$), tin oxide ($SnO_2$), zinc oxide (ZnO), an indium oxide-tin oxide alloy ($In_2O_3$—$SnO_2$, abbreviated as ITO), an indium oxide-zinc oxide alloy ($In_2O_3$—ZnO), and the metal oxide material including silicon or silicon oxide. In addition, a material that may be used is an Al material to which an element preventing hillock formation or whiskers appearing in a film of Al, such as Si, Ti, Ta, W, Mo, Cr, Nd, Sc, Y, or the like. Such an Al material improves heat resistance.

The conductive film can be either a single layer or a stack of two or more layers. For example, the conductive film can be a single-layer aluminum film containing silicon; a two-layer film of an aluminum film overlaid by a titanium film; or a three-layer film of a titanium film overlaid by an aluminum film overlaid by another titanium film. Alternatively, the conductive film can be a stack of a metal layer of Al, Cu, or the like and a refractory metal layer of Cr, Ta, Ti, Mo, W, or the like.

Next, a resist mask is formed over the conductive film in the second photolithography process and selective etching is performed, thereby forming the first electrode 415a and the second electrode 415b. Then, the resist mask is removed (see FIG. 12B). The first electrode 415a serves as one of the source electrode and drain electrode, while the second electrode 415b serves as the other of the source electrode and drain electrode. At that time, the first electrode 415a and the second electrode 415b are preferably etched so as to have tapered ends because coverage with the gate insulating layer formed thereon will be improved. Note that resist mask for forming the first electrode 415a and the second electrode 415b may be formed by the inkjet method. The formation of the resist mask by the inkjet method does not use a photomask; thus, manufacturing cost can be reduced.

In this embodiment, a 150-nm-thick titanium film is formed by sputtering to be the first electrode 415a and the second electrode 415b.

In the etching of the conductive film, the material for each layer and the etching conditions need to be adjusted as appropriate in order to prevent the oxide semiconductor layer 412 from being removed and the insulating layer 407 provided thereunder from being exposed. Therefore, in this embodiment, an In—Ga—Zn—O-based oxide semiconductor is used as the oxide semiconductor layer 412, a titanium film is used as the conductive film, and the etchant used is an ammonium hydrogen peroxide mixture (a mixture of ammonia, water, and a hydrogen peroxide solution) so that part of the oxide semiconductor layer 412 may not be etched. However, the present invention is not limited thereto. Part of the oxide semiconductor layer 412 can be etched in the second photolithography process and an oxide semiconductor layer having a groove (a depression portion) can be formed.

Ultraviolet, KrF laser light, or ArF laser light is used for light exposure for forming the resist mask in the second photolithography process. A channel length L of the transistor formed later depends on the width of an interval between the lower end of the first electrode 415a and the lower end of the second electrode 415b which are formed over the oxide semiconductor layer 412. Note that in the case of light exposure whereby the channel length L of less than 25 nm is provided, extreme ultraviolet with extremely short wavelengths of several nanometers to several tens of nanometers is used for light exposure for forming the resist mask in the second photolithography process. Light exposure with extreme ultraviolet leads to a high resolution and a large depth of focus. Consequently, the channel length L of the transistor formed later can be 10 to 1000 nm. In this case, an increase in the operation speed of the transistor can be achieved, and further, a reduction in the power consumption of the transistor can be achieved because of extremely low off-state current.

Figure 12C:
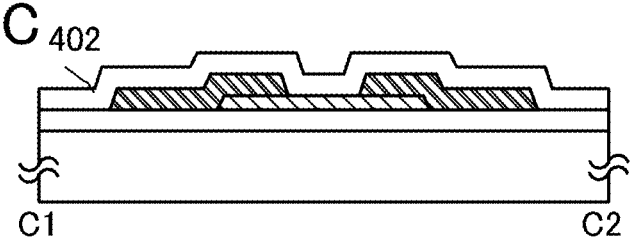
Figure 12D:
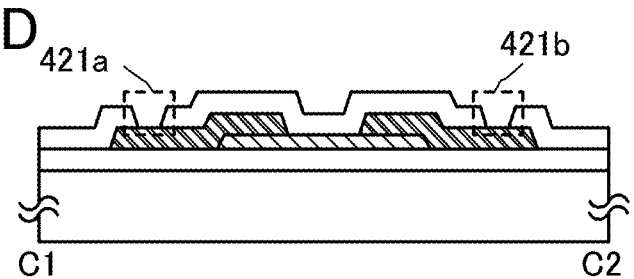

Then, the gate insulating layer 402 is formed over the insulating layer 407, the oxide semiconductor layer 412, the first electrode 415a, and the second electrode 415b (see FIG. 12C).

The gate insulating layer 402 can be a single layer or a stack of a silicon oxide layer, a silicon nitride layer, a silicon oxynitride layer, a silicon nitride oxide layer, or an aluminum oxide layer by plasma CVD, sputtering, or the like.

When the gate insulating layer 402 is formed, hydrogen is preferably not contained therein. In view of this, the gate insulating layer 402 is preferably deposited by sputtering in which hydrogen in an atmosphere used for the deposition can be minimized. In the case of forming a silicon oxide film by sputtering, the target used is a silicon target or a quartz target, and the sputtering gas used is oxygen or a mixed gas of oxygen and argon.

The gate insulating layer 402 can be a stack of a silicon oxide layer overlaid by a silicon nitride layer, which are over the first electrode 415a and the second electrode 415b. For example, the gate insulating layer 402 can be a 100-nm-thick stack of a first gate insulating layer which is a silicon oxide layer ($SiO_x$ (x>0)) with a thickness of 5 to 300 nm overlaid by a second gate insulating layer which is a silicon nitride layer ($SiN_y$ (y>0)) with a thickness of 50 to 200 nm. In this embodiment, the gate insulating layer 402 is a 100-nm-thick silicon oxide layer formed by RF sputtering under a pressure of 0.4 Pa, a high-frequency power of 1.5 kW, and in atmosphere of oxygen and argon (the flow rate ratio of oxygen to argon is 25 sccm:25 sccm=1:1).

Next, in the third photolithography process, a resist mask is formed and selective etching is performed, thereby removing part of the gate insulating layer 402. Thus, openings 421a and 421b reaching the first electrode 415a and the second electrode 415b are formed (see FIG. 12D). Note that the formation of the resist mask by the inkjet method does not use a photomask; thus, manufacturing cost can be reduced.

Then, a conductive film is formed over the gate insulating layer 402 and in the openings 421a and 421b. In a next step, the gate electrode 411, the first wiring 414a, and the second wiring 414b are formed in the fourth photolithography process.

The gate electrode 411, the first wiring 414a, and the second wiring 414b can be a single layer or a stack using a metal material such as molybdenum, titanium, chromium, tantalum, tungsten, aluminum, copper, neodymium, or scandium, or an alloy material whose main component is any of these materials. Specific examples of the two-layer structure applicable to the gate electrode 411, the first wiring 414a, and the second wiring 414b include a stack of an aluminum layer overlaid by a molybdenum layer, a stack of a copper layer overlaid by a molybdenum layer, a stack of a copper layer overlaid by a titanium nitride layer or a tantalum nitride layer, and a stack of a titanium nitride layer overlaid by a molybdenum layer. Specific examples of the three-layer structure include a stack of a tungsten layer or a tungsten nitride layer, an alloy layer of aluminum and silicon or aluminum and titanium, and a titanium nitride layer or a titanium layer. Note that the gate electrode layer can be formed using a light-transmitting conductive film. A specific example of the light-transmitting conductive film is a film of a light-transmitting conductive oxide.

In this embodiment, as the gate electrode 411, the first wiring 414a, and the second wiring 414b, a 150-nm-thick titanium film is formed by sputtering.

Then, the second heat treatment (preferably, at 200 to 400° C., for example, at 250 to 350° C.) is performed in an inert gas atmosphere or in an oxygen gas atmosphere. In this embodiment, the second heat treatment is performed in a nitrogen atmosphere at 250° C. for one hour. Note that the second heat treatment can be performed after a protective insulating layer or a planarization insulating layer is formed over the transistor 410.

Additional heat treatment can be performed at 100 to 200° C. in air for 1 hour to 30 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure is preferable in shortening the heating time.

Figure 12E:
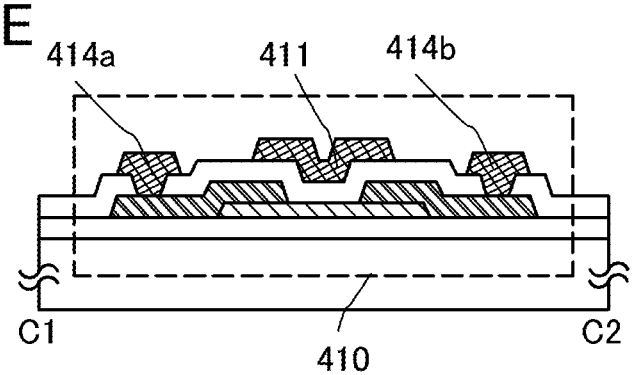

Through the above process, the transistor 410 including the high-purity oxide semiconductor layer 412 in which the concentration of hydrogen, moisture, hydride, and hydroxide is reduced can be formed (see FIG. 12E). The transistor 410 can be used as the transistor 303 described in Embodiment 2, for example.

A protective insulating layer or a planarization insulating layer can be provided over the transistor 410. The protective insulating layer can be a single layer structure or a stack of any of a silicon oxide layer, a silicon nitride layer, a silicon oxynitride layer, a silicon nitride oxide layer, and an aluminum oxide layer. The planarization insulating layer can be formed using a heat-resistant organic material, such as polyimide, acrylic resin, benzocyclobutene resin, polyamide, or epoxy resin. Alternatively, the planarization insulating layer can be formed using a low-dielectric constant material (a low-k material), a siloxane-based resin, phosphosilicate glass (PSG), borophosphosilicate glass (BPSG), or the like. Further alternatively, the planarization insulating layer can be a stack of a plurality of insulating films formed using any of these materials.

Here, the siloxane-based resin corresponds to a resin including a Si—O—Si bond which is formed using a siloxane-based material as a starting material. The siloxane-based resin can include an organic group (e.g., an alkyl group or an aryl group) or a fluoro group as a substituent. The organic group can include a fluoro group.

There is no particular limitation on the method for forming the planarization insulating layer. The method or tool (apparatus) used for forming the planarization insulating layer is selected, according to the material therefor, from the following ones: sputtering, SOG, spin coating, dipping, spray coating, a droplet discharge method (e.g., the inkjet method, screen printing, or offset printing), a doctor knife, a roll coater, a curtain coater, a knife coater, and the like.

As described above, by removing moisture remaining in the reaction atmosphere in the formation of the oxide semiconductor layer, the concentration of hydrogen and hydride in the oxide semiconductor layer can be reduced.

As described in this embodiment, by using the transistor including a high-purity oxide semiconductor material for the modulation circuit, the off-state current of the transistor can be reduced. This leads to more stable operation of the modulation circuit and reduces excessive power consumption of the modulation circuit.

Embodiment 5

In this embodiment, the transistor having a configuration different from that described in Embodiment 4 and a fabricating method thereof will be described with reference to FIGS. 13A to 13E.

Figure 13A:
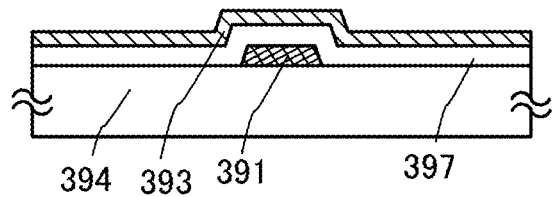
FIGS. 13A to 13E are cross-sectional views showing an example of a method for manufacturing a transistor.
Figure 13B:
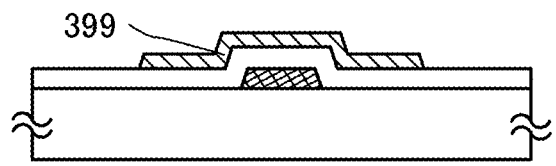
Figure 13C:
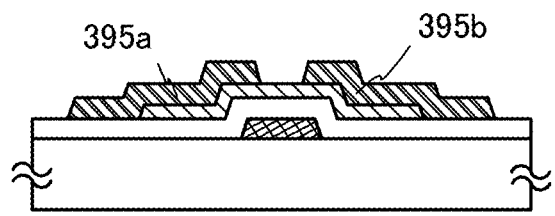
Figure 13D:
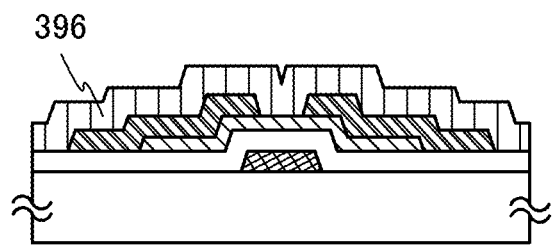
Figure 13E:
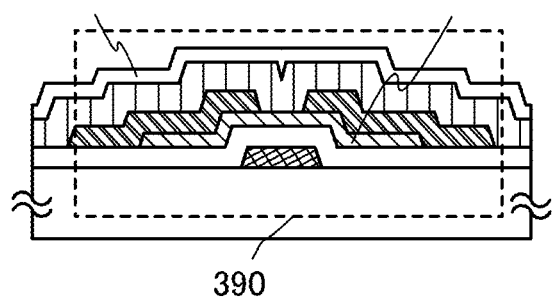
Figure 14A:
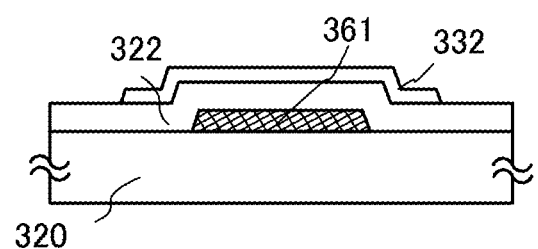
FIGS. 14A to 14D are cross-sectional views showing an example of a method for manufacturing a transistor.
Figure 14B:
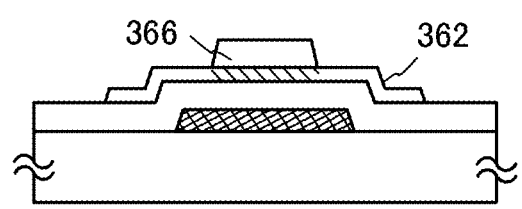
Figure 14C:
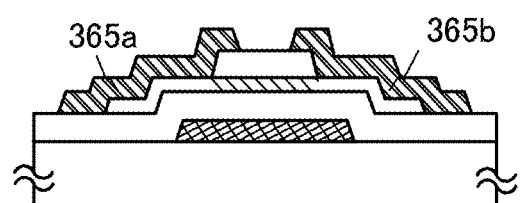
Figure 14D:
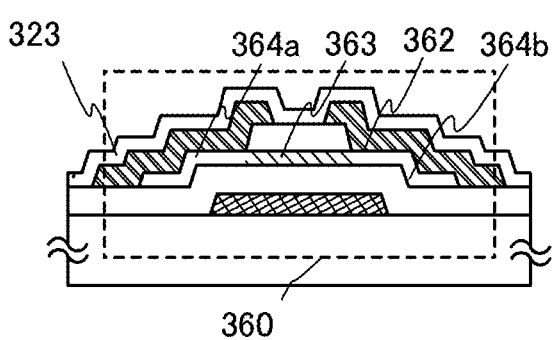

FIGS. 13A to 13E show an example of a cross-sectional structure of a transistor. A transistor 390 shown in FIG. 13E is a bottom gate transistor and is also referred to as an inverted staggered transistor. The transistor 390 can be used as the transistor 303 described in Embodiment 2, for example. Note that although the transistor 390 is a single-gate transistor, the present invention is not limited to this structure. The transistor can be a multi-gate transistor including a plurality of gate electrodes and a plurality of channel formation regions.

A process of manufacturing the transistor 390 over a substrate 394 will be described below with reference to FIGS. 13A to 13E.

First, a conductive film is formed over the substrate 394, and then, a gate electrode 391 is formed in the first photolithography process. It is preferable that an end portion of the formed gate electrode be tapered because coverage with a gate insulating layer formed thereover is improved. Note that a resist mask may be formed by the inkjet method. The formation of the resist mask by the inkjet method does not use a photomask; thus, manufacturing cost can be reduced.

The substrate 394 can be formed using a material similar to that for the substrate 400 described in Embodiment 2. The gate electrode 391 can be formed using a material and a deposition method similar to those of the gate electrode 411 described in Embodiment 2.

Note that an insulating film serving as a base film can be provided between the substrate 394 and the gate electrode 391. The base film has a function of preventing diffusion of impurity elements from the substrate 394, and can be a single layer or a stack of any of a silicon nitride film, a silicon oxide film, a silicon nitride oxide film, and a silicon oxynitride film.

Then, a gate insulating layer 397 is formed over the gate electrode 391.

The gate insulating layer 397 can be a single layer or a stack of any of a silicon oxide layer, a silicon nitride layer, a silicon oxynitride layer, a silicon nitride oxide layer, and an aluminum oxide layer by plasma CVD, sputtering, or the like. Note that in order to prevent the gate insulating layer 397 from containing a large amount of hydrogen, the gate insulating layer 397 is preferably formed by sputtering. In the case of forming a silicon oxide film by sputtering, the target used is a silicon target or a quartz target, and the sputtering gas used is oxygen or a mixed gas of oxygen and argon.

The gate insulating layer 397 can be a stack of a silicon nitride layer overlaid by a silicon oxide layer, which are over the gate electrode 391. For example, the gate insulating layer 397 can be a 100-nm-thick stack of a first gate insulating layer which is a silicon nitride layer ($SiN_y$ ($y>0$)) with a thickness of 50 to 200 nm formed by sputtering and overlaid by a second gate insulating layer which is a silicon oxide layer ($SiO_x$ ($x>0$)) with a thickness of 5 to 300 nm.

Then, the oxide semiconductor layer 393 with a thickness of 2 to 200 nm is formed over the gate insulating layer 397 (see FIG. 13A).

The oxide semiconductor layer 393 can be formed using a material and a formation method similar to those of the oxide semiconductor layer (the island-shaped oxide semiconductor layer 412) described in Embodiment 2.

As an example of the deposition condition in the case where the oxide semiconductor layer 393 is formed by sputtering, the following condition can be given: the distance between the substrate and the target is 100 mm, the pressure is 0.6 Pa, the direct current (DC) power supply is 0.5 kW, and the atmosphere is oxygen (the proportion of the oxygen flow is 100%). Note that a pulse direct current (DC) power supply is preferable because dust can be reduced and the film thickness can be made uniform. The thickness of the oxide semiconductor layer 393 is 2 to 200 nm, and preferably 5 to 30 nm. Note that an appropriate thickness of the oxide semiconductor layer varies depending on the material used therefor; and the thickness is determined as appropriate depending on the material.

Note that before the oxide semiconductor layer 393 is formed, dust attached to a surface of the gate insulating layer 397 is preferably removed by reverse sputtering in which an argon gas is introduced and plasma is generated.

Further, in order that hydrogen, hydroxyl, and moisture may be contained in the gate insulating layer 397 and the oxide semiconductor layer 393 as little as possible, it is preferable that the substrate 394 over which the gate electrode 391 is formed or the substrate 394 over which layers up to the gate insulating layer 397 are formed be preheated in a preheating chamber of a sputtering apparatus as pretreatment for the film formation so that impurities such as hydrogen and moisture adsorbed to the substrate 394 are evacuated from the chamber. The temperature of the preheating may be 100 to 400° C., and preferably 150 to 300° C. As an evacuation means, a cryopump is preferably provided in the preheating chamber. Further, this preheating may be similarly performed on the substrate 394 over which layers up to and including a first electrode 395a and a second electrode 395b are formed, before a protective insulating layer 396 is formed.

Then, an oxide semiconductor layer is processed into an island-shaped oxide semiconductor layer 399 in the second photolithography process (see FIG. 13B). Note that the processing method of the island-shaped oxide semiconductor layer 399 is similar to that of the island-shaped oxide semiconductor layer 412 described in Embodiment 2.

Note that it is preferable that reverse sputtering be performed before a conductive film is formed in the subsequent step, in order to remove a resist residue or the like attached on the surfaces of the oxide semiconductor layer 399 and the gate insulating layer 397.

Then, a conductive film is formed over the gate insulating layer 397 and the oxide semiconductor layer 399. The conductive film can be formed by sputtering or a vacuum evaporation method. The material for the conductive film can be an element selected from Al, Cr, Cu, Ta, Ti, Mo, and W; an alloy containing any of these elements as its component; an alloy containing a plurality of these elements in combination; and the like. Further, the material for the conductive film can be one or a combination of materials selected from manganese, magnesium, zirconium, beryllium, and thorium. Further, the conductive film can be a light-transmitting conductive film. A specific example of the light-transmitting conductive film is a film of a light-transmitting conductive oxide.

The conductive film can be either a single layer or a stack of two or more layers. For example, the conductive film can be a single-layer aluminum film containing silicon; a two-layer film of an aluminum film overlaid by a titanium film; or a three-layer film of a titanium film overlaid by an aluminum film overlaid by another titanium film.

Then, in the third photolithography process, a resist mask is formed over the conductive film, and selective etching is performed, thereby forming the first electrode 395a and the second electrode 395b. Then, the resist mask is removed (see FIG. 13C). In the etching of the conductive film, the material for each layer and the etching conditions need to be adjusted as appropriate in order to prevent the oxide semiconductor layer 399 from being removed and the gate insulating layer 397 provided thereunder from being exposed. Therefore, in this embodiment, an In—Ga—Zn—O-based oxide semiconductor is used as the oxide semiconductor layer 399, a titanium film is used as the conductive film, and an ammonium hydrogen peroxide mixture (a mixture of ammonia, water, and a hydrogen peroxide solution) is used as an etchant so that part of the oxide semiconductor layer 399 may not be etched. However, the present invention is not limited thereto. Part of the oxide semiconductor layer 399 can be etched in the third photolithography process and an oxide semiconductor layer having a groove (a depression portion) can be formed.

Ultraviolet, KrF laser light, or ArF laser light is used for light exposure for forming the resist mask in the third photolithography process. A channel length L of the transistor to be formed later depends on the width of an interval between a lower end of the source electrode 395a and a lower end of the drain electrode 395b which are formed over the oxide semiconductor layer 399. Note that when light exposure is performed to provide the channel length L of less than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of focus. Therefore, the channel length L of the transistor formed later can be 10 to 1000 nm, which leads to an increase in operation speed of the circuit, and a reduction in the power consumption of the transistor because of extremely small off-state current.

In order to reduce the number of the photomasks used in the photolithography process or the number of fabrication steps, etching process can be performed using a resist mask made by a multi-tone mask which is a light-exposure mask such that light transmitted by the mask has a plurality of intensities. A resist mask made by a multi-tone mask has a plurality of thicknesses and can be further changed in shape by etching; thus, such a resist mask can be used in a plurality of etching processes for different patterns. Thus, a resist mask applicable to at least two or more kinds of different patterns can be made by a single multi-tone mask. This reduces the number of exposure masks and also the number of corresponding photolithography processes, thereby simplifying the process.

In addition, plasma treatment using a gas such as $N_2O$, $N_2$, or Ar can be performed to remove water or the like adsorbed on an exposed surface of the oxide semiconductor layer 399. Plasma treatment can be performed using a mixed gas of oxygen and argon. In this embodiment, either plasma treatment is performed.

After the plasma treatment, a protective insulating layer 396 which is in contact with the exposed oxide semiconductor layer 399, the first electrode 395a, and the second electrode 395b is formed without exposure to air (see FIG. 13D). At that time, it is preferable that the protective insulating layer 396 be formed while moisture remaining in the process chamber is removed so that the oxide semiconductor layer 399 and the protective insulating layer 396 can be prevented from including hydrogen, hydroxyl, or moisture. In order to remove moisture remaining in the process chamber, a sorption vacuum pump is preferably used. For example, a cryopump, an ion pump, or a titanium sublimation pump is preferably used. In a deposition chamber which is evacuated with a cryopump, hydrogen atoms, compounds including hydrogen atoms such as water ($H_2O$), and the like are exhausted. Accordingly, the concentration of impurities contained in the protective insulating layer 396 formed in the deposition chamber can be reduced.

In this embodiment, an oxide insulating layer is formed as the protective insulating layer 396. A silicon oxide layer is formed as the protective insulating layer 396 in the following conditions: the substrate 394 over which layers up to the island-shaped oxide semiconductor layer 399, the first electrode 395a, and the second electrode 395b are formed is kept at room temperature or heated to a temperature lower than 100° C., a sputtering gas including high-purity oxygen from which hydrogen and moisture are removed is introduced, and a silicon semiconductor target is used. Note that instead of a silicon oxide layer, a silicon oxynitride layer, an aluminum oxide layer, an aluminum oxynitride layer, or the like can be used as the oxide insulating layer.

For example, a silicon oxide layer is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power supply is 6 kW, and the atmosphere is oxygen (the proportion of the oxygen flow is 100%). The thickness of the silicon oxide layer is 300 nm. Note that instead of a silicon target, quartz (preferably, synthetic quartz) can be used. The sputtering gas used is an oxygen gas or a mixed gas of oxygen and argon.

Additional heat treatment is preferably performed at 100 to 400° C. while the protective insulating layer 396 and the oxide semiconductor layer 399 are in contact with each other. Since the protective insulating layer 396 of this embodiment has many defects, this heat treatment allows impurities such as hydrogen, moisture, hydroxyl, or hydride contained in the oxide semiconductor layer 399 to be diffused into the protective insulating layer 396, so that the impurities contained in the oxide semiconductor layer 399 are further reduced.

Through the above process, the transistor 390 including the oxide semiconductor layer 392 in which the concentration of hydrogen, moisture, hydroxyl, and hydroxide is reduced can be formed (see FIG. 13E). As described in this embodiment, by removing moisture remaining in the reaction atmosphere in the deposition of the oxide semiconductor layer, the concentration of hydrogen and hydride in the oxide semiconductor layer can be reduced. As a result, an intrinsic or substantially intrinsic semiconductor layer can be obtained.

Note that an insulating layer may be additionally provided over the protective insulating layer 396. In this embodiment, a protective insulating layer 398 is formed over the protective insulating layer 396. The insulating layer 398 can be a silicon nitride film, a silicon nitride oxide film, an aluminum nitride film, an aluminum nitride oxide film, or the like.

For the formation of the insulating layer 398, the substrate 394 over which layers up to the protective insulating layer 396 are formed is heated to a temperature of 100 to 400° C., a sputtering gas including high-purity nitrogen from which hydrogen and moisture have been removed is introduced, and a silicon semiconductor target is used, whereby a silicon nitride film is formed. In this step also, it is preferable that the insulating layer 398 be formed while moisture remaining in the process chamber is removed as in the case of the protective insulating layer 396. By heating the substrate 394 to 100 to 400° C. in the deposition of the insulating layer 398, hydrogen or moisture in the oxide semiconductor layer 399 can be diffused into the insulating layer 398. In that case, heat treatment is not necessarily performed directly after the formation of the protective insulating layer 396.

In the case where a silicon oxide layer is formed as the protective insulating layer 396 and a silicon nitride layer is formed as the insulating layer 398, the silicon oxide layer and the silicon nitride layer can be formed in the same process chamber using the same silicon target. First, a sputter gas containing oxygen is introduced and a silicon oxide layer is formed using a silicon target provide in the process chamber, and then the sputter gas is switched to a sputter gas containing nitrogen and a silicon nitride layer is formed using the same silicon target. Since the silicon oxide layer and the silicon nitride layer can be formed in succession without exposure to air, impurities such as hydrogen or moisture can be prevented from being adsorbed on a surface of the silicon oxide layer. Note that after the silicon oxide layer is formed as the protective insulating layer 396 and the silicon nitride layer is formed thereover as the insulating layer 398, heat treatment (at a temperature of 100 to 400° C.) for diffusion of hydrogen or moisture in the oxide semiconductor layer into the oxide insulating layer is preferably performed.

After the formation of the protective insulating layer 396, additional heat treatment can be performed at 100 to 200° C. in air for 1 to 30 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure shortens the heating time.

Since the above process can be performed at a temperature of 400° C. or less, the process can be preferably applied to a fabricating process using a glass substrate having a side longer than 1 m and a thickness of 1 mm or less. In addition, since the whole process can be performed at a treatment temperature of 400° C. or less, a semiconductor device can be manufactured with less energy consumption.

As described in this embodiment, by using the transistor including a high-purity oxide semiconductor material for the modulation circuit, the off-state current of the transistor can be reduced. This leads to more stable operation of the modulation circuit and reduces excessive power consumption of the modulation circuit.

Embodiment 6

In this embodiment, the transistor having a configuration different from those described in Embodiments 4 and 5 and a fabricating method thereof will be described with reference to FIGS. 14A to 14E.

FIGS. 14A to 14D show an example of the cross-sectional structure of a transistor. A transistor 360 shown in FIG. 14A to 14D is a sort of channel-protective type (channel-stop type) bottom gate transistor and is also referred to as an inverted staggered transistor. The transistor 360 can be used as the transistor 303 described in Embodiment 2. Note that although the transistor 360 is a single-gate transistor, the present invention is not limited to the structure. The transistor can be a multi-gate transistor including a plurality of gate electrodes and a plurality of channel formation regions.

A process of manufacturing the transistor 360 over a substrate 320 will be described below with reference to FIGS. 14A to 14D.

First, a conductive film is formed over the substrate 320, and then, a gate electrode 361 is formed in the first photolithography process. The material for the substrate 320 can be similar to that for the substrate 394 described in Embodiment 3. The material and the deposition method for the gate electrode 361 can be similar to those for the gate electrode 391 described in Embodiment 3.

Then, a gate insulating layer 322 is formed over the gate electrode 361. The material for the gate insulating layer 322 can be similar to that for the gate insulating layer 397 described in Embodiment 2. In this embodiment, a silicon oxynitride layer with a thickness of 100 nm or less is formed by plasma CVD as the gate insulating layer 322.

Then, an oxide semiconductor layer with a thickness of 2 to 200 nm is formed over the gate insulating layer 322 and processed into an island-shaped oxide semiconductor layer in the second photolithography process. The material and the formation method for the island-shaped oxide semiconductor layer can be similar to those for the island-shaped oxide semiconductor layer 399 described in Embodiment 3. In this embodiment, the oxide semiconductor layer is formed by sputtering using an In—Ga—Zn—O-based metal oxide target.

Then, the oxide semiconductor layer is dehydrated or dehydrogenated. The temperature of the first heat treatment for the dehydration or dehydrogenation is 400 to 750° C., preferably 400° C. or higher and lower than the strain point of the substrate. Here, the substrate is put in an electric furnace which is a sort of heat treatment apparatus and heat treatment is performed on the oxide semiconductor layer in a nitrogen atmosphere at 450° C. for one hour. After that, the oxide semiconductor layer is prevented from being exposed to air and from including water or hydrogen again; thus the oxide semiconductor layer 332 is obtained (see FIG. 14A).

Then, plasma treatment using a gas such as $N_2O$, $N_2$, or Ar is performed. By this plasma treatment, water or the like adhering to an exposed surface of the oxide semiconductor layer is removed. Plasma treatment can be performed using a mixed gas of oxygen and argon.

Then, an oxide insulating layer is formed over the gate insulating layer 322 and the oxide semiconductor layer 332. Then, in the third photolithography process, a resist mask is formed, and selective etching is performed, thereby forming the oxide insulating layer 366. Then, the resist mask is removed.

In this embodiment, a 200-nm-thick silicon oxide film is deposited as the oxide insulating layer 366 by sputtering. The substrate temperature in the deposition is room temperature to 300° C.; in this embodiment, the substrate temperature is 100° C. The silicon oxide film can be deposited by sputtering in a rare gas (typically, argon) atmosphere, an oxygen atmosphere, or an atmosphere of a rare gas (typically, argon) and oxygen. The target used can be a silicon oxide target or a silicon target. For example, with the use of a silicon target, a silicon oxide film can be formed by sputtering in an atmosphere of oxygen and nitrogen. The oxide insulating layer 366 having low resistance and being in contact with the oxide semiconductor layer is formed using an inorganic insulating film which does not contain impurities such as moisture, a hydrogen ion, and $OH^-$ and which prevents their entry from the outside. For examples, a silicon oxide film, a silicon oxynitride film, an aluminum oxide film, and an aluminum oxynitride film can be used as the inorganic insulating film.

At this time, it is preferable that the oxide insulating layer 366 be formed while moisture remaining in the process chamber is removed so that the oxide semiconductor layer 332 and the oxide insulating layer 366 may be prevented from containing hydrogen, hydroxyl, or moisture. The method for removing moisture remaining in the process chamber can be the same as that described in other embodiments.

Then, the second heat treatment (preferably at 200 to 400° C., e.g. 250 to 350° C.) is preferably performed in an inert gas atmosphere or in an oxygen gas atmosphere. For example, the second heat treatment is performed in a nitrogen atmosphere at 250° C. for one hour. In the second heat treatment, a portion of the oxide semiconductor layer (a channel formation region) is heated while being in contact with the oxide insulating layer 366.

In this embodiment, the oxide semiconductor layer 332 a part of which is exposed and which is provided with the oxide insulating layer 366 is subjected to heat treatment in a nitrogen atmosphere, an inert atmosphere, or under reduced pressure. The resistance of an exposed region of the oxide semiconductor layer 332 which is not covered with the oxide insulating layer 366 can be reduced by heat treatment in a nitrogen atmosphere, an inert gas atmosphere, or under reduced pressure. For example, the heat treatment can be performed in a nitrogen atmosphere at 250° C. for one hour.

The resistance of the exposed region of the oxide semiconductor layer 332 is reduced by the heat treatment performed, in a nitrogen atmosphere, on the oxide semiconductor layer 332 over which the oxide insulating layer 366 is formed; thus, an oxide semiconductor layer 362 including regions with different resistances (indicated as a shaded region and a white region in FIG. 14B) is formed.

Then, a conductive film is formed over the gate insulating layer 322, the oxide semiconductor layer 362, and the oxide insulating layer 366. After that, a resist mask is formed in the fourth photolithography process, and a first electrode 365a and a second electrode 365b are formed by selective etching. Then, the resist mask is removed (see FIG. 14C).

Examples of the material for the first electrode 365a and the second electrode 365 include an element selected from Al, Cr, Cu, Ta, Ti, Mo, and W; an alloy containing any of these elements as its component; and an alloy film containing any of these elements in combination. Further, the metal conductive film can be a single layer or a stack of two or more layers.

In the above steps, by heat treatment for dehydration or dehydrogenation, the oxide semiconductor layer becomes oxygen-deficient and thus having lower resistance, and then part of the oxide semiconductor layer is selectively made to be oxygen-excess. As a result, the channel formation region 363 overlapping with the gate electrode 361 becomes an i-type region. In addition, a low-resistance source region 364a overlapping with the first electrode 365a and a low-resistance drain region 364b overlapping with the second electrode 365b are formed in a self-aligned manner. The above steps allow the transistor 360 to be formed.

Additional heat treatment can be performed at 100 to 200° C. in air for 1 to 30 hours. In this embodiment, the heat treatment is performed at 150° C. for 10 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure shortens the heating time.

By forming the low-resistance drain region 364b (or the low-resistance source region 364a) in part of the oxide semiconductor layer which overlaps with the second electrode 365b (or the first electrode 365a), the reliability of the transistor can be improved. Specifically, by forming the low-resistance drain region 364b, the conductivity can vary in stages from the drain electrode to the low-resistance drain region 364b and the channel formation region 363. Therefore, in the case where the transistor operates with the second electrode 365b connected to wiring for supplying positive supply voltage VDD, the low-resistance drain region serves as a buffer and a high electric field is not applied locally even if a high electric field is applied between the gate electrode 361 and the second electrode 365b; thus, the breakdown voltage of the transistor can be improved.

Then, a protective insulating layer 323 is formed over the first electrode 365a, the second electrode 365b, and the oxide insulating layer 366. In this embodiment, the protective insulating layer 323 is formed using a silicon nitride film (see FIG. 14D).

As described in this embodiment, by using the transistor including a high-purity oxide semiconductor material for the modulation circuit, the off-state current of the transistor can be reduced. This leads to more stable operation of the modulation circuit and reduces excessive power consumption of the modulation circuit.

Embodiment 7

In this embodiment, another example of a transistor which can be applied to the modulation circuit will be described. The process of fabricating a transistor 350 over a substrate 340 will be described below with reference to FIGS. 15A to 15D.

First, a conductive film is formed over the substrate 340, and then, a gate electrode 351 is formed in the first photolithography process. In this embodiment, a 150-nm-thick tungsten film is formed as the gate electrode 351 by sputtering.

Then, a gate insulating layer 342 is formed over the gate electrode 351. In this embodiment, a silicon oxynitride film having a thickness of 100 nm or less is formed by plasma CVD as the gate insulating layer 342.

Then, a conductive film is formed over the gate insulating layer 342. In the second photolithography process, a resist mask is formed over the conductive film, and selective etching is performed, thereby forming a source electrode 355a and a drain electrode 355b. Then, the resist mask is removed (see FIG. 15A).

Figure 15A:
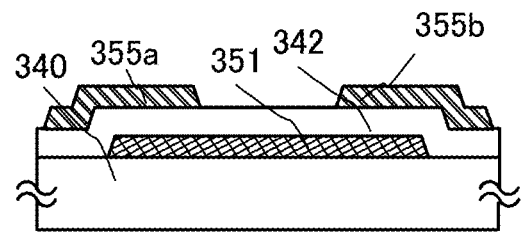
FIGS. 15A to 15D are cross-sectional views showing an example of a method for manufacturing a transistor.
Figure 15B:
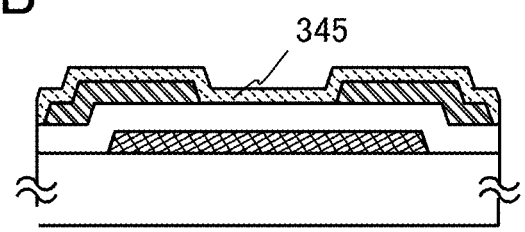
Figure 15C:
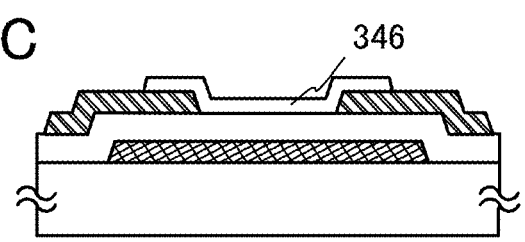

Then, an oxide semiconductor layer 345 is formed (see FIG. 15B). In this embodiment, the oxide semiconductor layer 345 is formed by sputtering using an In—Ga—Zn—O-based metal oxide target. Then, the oxide semiconductor layer 345 is processed into an island-shaped oxide semiconductor layer in the third photolithography process.

In the step of forming the oxide semiconductor layer 345, it is preferable that the oxide semiconductor layer 345 be formed while moisture remaining in the process chamber is removed so that the oxide semiconductor layer 345 may be prevented from containing hydrogen, hydroxyl, or moisture. The method for removing moisture remaining in the process chamber can be the same as that described in other embodiments.

Then, in order to dehydrate or dehydrogenate the oxide semiconductor layer, the first treatment is performed. The temperature of the first heat treatment is between 400 to 750° C., preferably 400° C. or higher and lower than the strain point of the substrate. Here, the substrate is put in an electric furnace which is a sort of heat treatment apparatus and heat treatment is performed on the oxide semiconductor layer in a nitrogen atmosphere at 450° C. for one hour. After that, the oxide semiconductor layer is prevented from being exposed to air and from containing water or hydrogen again. Thus, an oxide semiconductor layer 346 is obtained (see FIG. 15C).

The first heat treatment can employ GRTA, in which the substrate is transferred into an inert gas heated to a high temperature of 650 to 700° C., and heated for several minutes there, and then the substrate is transferred out of the inert gas heated to a high temperature.

Then, a protective insulating film 356 being in contact with the oxide semiconductor layer 346 is formed. The protective insulating film 356 has a thickness of 1 nm or more and can be formed by using as appropriate a method by which impurities such as water or hydrogen is not mixed into the protective insulating film 356 (e.g. sputtering). When hydrogen is contained in the protective insulating film 356, hydrogen may enter the oxide semiconductor layer or the extraction of oxygen in the oxide semiconductor layer caused by hydrogen may occur, and the resistance of a backchannel of the oxide semiconductor layer (which causes the transistor to be an n-type transistor) may be reduced, which may cause a parasitic channel to be formed. Therefore, it is important to form the protective insulating film 356 by a method by which hydrogen contained in the protective insulating film 356 is reduced as much as possible.

Note that the material and the formation method for the protective insulating film 356 can be similar to those for the oxide insulating layer 396 described in Embodiment 3.

Then, the second heat treatment (preferably at 200 to 400° C., e.g. 250 to 350° C.) is performed in an inert gas atmosphere or in an oxygen gas atmosphere. For example, the second heat treatment is performed in a nitrogen atmosphere at 250° C. for one hour. In the second heat treatment, a portion of the oxide semiconductor layer (a channel formation region) is heated while being in contact with the protective insulating film 356.

In the above steps, by heat treatment for dehydration or dehydrogenation, the oxide semiconductor layer becomes oxygen-deficient and thus having lower resistance, and then part of the oxide semiconductor layer is selectively made to be oxygen-excess. As a result, an i-type oxide semiconductor layer 352 is formed. The above steps allow the transistor 350 to be formed.

Additional heat treatment can be performed at 100 to 200° C. in air for 1 to 30 hours. In this embodiment, the heat treatment is performed at 150° C. for 10 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the protective insulating film is formed. Heat treatment under reduced pressure shortens the heating time. This heat treatment causes hydrogen to be introduced from the oxide semiconductor layer to the protective insulating film; thus, a normally-off transistor can be obtained.

Note that an insulating layer may be additionally provided over the protective insulating film 356. In this embodiment, an insulating layer 343 is formed over the protective insulating film 356 (see FIG. 15D). The material and the formation method for the insulating layer 343 can be similar to those for the protective insulating layer 398 described in Embodiment 3. Further, a planarization insulating layer (e.g. a resin layer) can be provided for the purpose of forming a flat surface over the insulating layer 343.

Figure 15D:
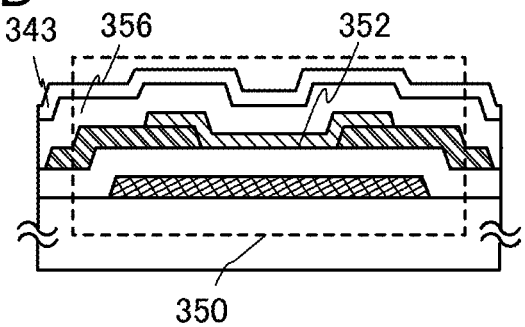

Note that although the transistor 350 in FIG. 15D is a single-gate transistor, the present invention is not limited to this configuration. The transistor can be a multi-gate transistor including a plurality of gate electrodes and a plurality of channel formation regions.

As described in this embodiment, by using the transistor including a high-purity oxide semiconductor material for the modulation circuit, the off-state current of the transistor can be reduced. This leads to more stable operation of the modulation circuit and reduces excessive power consumption of the modulation circuit.

Embodiment 8

In this embodiment, application examples of the RF tag including the modulation circuit according to one embodiment of the present invention will be described with reference to FIGS. 10A to 10F. RF tags find wide applications; for example, RF tags may be used in products such as bills, coins, securities, bearer bonds, certificates (driver's licenses, resident cards, or the like (see FIG. 10A)), containers for wrapping objects (wrapping paper, bottles, or the like (see FIG. 10C)), recording media (DVDs, video tapes, or the like (see FIG. 10B)), vehicles (bicycles or the like (see FIG. 10D)), products such as personal belongings (bags, glasses, or the like), foods, plants, animals, human bodies, clothes, commodities, or electronic devices (liquid crystal display devices, EL display devices, television sets, or cellular phones), or objects such as shipping tags of products (see FIGS. 10E and 10F).

An RF tag 4000 according to one embodiment of the present invention is secured to products by, for example, being mounted on a printed wiring board, being attached to a surface thereof, or being embedded therein. For example, when secured to a book, the RF tag 4000 is embedded in paper, and when secured to a package made of an organic resin, the RF tag 4000 is embedded inside the organic resin. The RF tag 4000 according to one embodiment of the present invention is small, thin, and lightweight, so that the design of a product is not impaired even after the RF tag 4000 is secured thereto. Further, bills, coins, securities, bearer bonds, documents, or the like can have identification functions when provided with the RF tag 4000 according to one embodiment of the present invention. Such identification functions can prevent counterfeits. Furthermore, the efficiency of a system such as an inspection system can be improved by providing the RF tag according to one embodiment of the present invention in, for example, containers for wrapping objects, recording media, personal belongings, foods, clothes, commodities, electronic appliances, or the like. Moreover, vehicles can have higher security against theft or the like when provided with the RF tag according to one embodiment of the present invention.

When provided with the RF tag including the modulation circuit according to one embodiment of the present invention as described above, the above products can be identified with higher reliability and with a longer communication distance than the conventional way.

This application is based on Japanese Patent Application serial no. 2009-265054 filed with the Japan Patent Office on Nov. 20, 2009, the entire contents of which are hereby incorporated by reference.

What is claimed is:
1. A semiconductor device comprising:
a load; and
a transistor, the transistor comprising an oxide semiconductor layer, the oxide semiconductor layer comprising a channel formation region, wherein the load is electrically connected to one of a source or a drain of the transistor,
wherein a carrier concentration in the oxide semiconductor layer is less than $1 \times 10^{14}/cm^3$,
wherein hydrogen concentration of the oxide semiconductor layer is less than or equal to $5 \times 10^{19}/cm^3$, and
wherein an off-state current per channel width of the transistor is less than or equal to $1 \times 10^{-16}$ A/μm at a temperature within a range from −30° C. to 120° C.

2. The semiconductor device according to claim 1, wherein whether the transistor is on-state or off-state is controlled in accordance with a signal inputted to a gate of the transistor.

3. The semiconductor device according to claim 1, wherein the load comprises at least one of a resistor and a capacitor.

4. A cellular phone comprising the semiconductor device according to claim 1.

5. The semiconductor device according to claim 1,
wherein the oxide semiconductor layer comprises indium, zinc and gallium, and
wherein the oxide semiconductor layer has a microcrystalline structure.

6. A semiconductor device comprising:
a diode; and
a transistor, the transistor comprising an oxide semiconductor layer, the oxide semiconductor layer comprising a channel formation region, wherein the diode is electrically connected to one of a source or a drain of the transistor,
wherein a carrier concentration in the oxide semiconductor layer is less than $1 \times 10^{14}/cm^3$,
wherein hydrogen concentration of the oxide semiconductor layer is less than or equal to $5 \times 10^{19}/cm^3$, and
wherein an off-state current per channel width of the transistor is less than or equal to $1 \times 10^{-16}$ A/μm at a temperature within a range from −30° C. to 120° C.

7. The semiconductor device according to claim 6, wherein whether the transistor is on-state or off-state is controlled in accordance with a signal inputted to a gate of the transistor.

8. A cellular phone comprising the semiconductor device according to claim 6.

9. The semiconductor device according to claim 6,
wherein the oxide semiconductor layer comprises indium, zinc and gallium, and
wherein the oxide semiconductor layer has a microcrystalline structure.

10. A semiconductor device comprising:
a load; and
a transistor, the transistor comprising an oxide semiconductor layer, the oxide semiconductor layer comprising a channel formation region, wherein the load is electrically connected to one of a source or a drain of the transistor,
wherein a carrier concentration in the oxide semiconductor layer is less than $1 \times 10^{14}/cm^3$, and
wherein an off-state current per channel width of the transistor is less than or equal to $1 \times 10^{-16}$ A/μm at a temperature within a range from −30° C. to 120° C.

11. The semiconductor device according to claim 10, wherein whether the transistor is on-state or off-state is controlled in accordance with a signal inputted to a gate of the transistor.

12. The semiconductor device according to claim 10, wherein the load comprises at least one of a resistor and a capacitor.

13. A cellular phone comprising the semiconductor device according to claim 10.

14. A semiconductor device comprising:
an antenna; and
a modulation circuit comprising:
  a load; and
  a transistor comprising an oxide semiconductor layer, the oxide semiconductor layer comprising a channel formation region,
wherein a carrier concentration in the oxide semiconductor layer is less than $1\times10^{14}/cm^3$,
wherein one of a source and a drain of the transistor is electrically connected to one terminal of the antenna through the load, and the other of the source and the drain of the transistor is electrically connected to the other terminal of the antenna, and
wherein an off-state current per channel width of the transistor is less than or equal to $1\times10^{-16}$ A/μm at a temperature within a range from −30° C. to 120° C.

15. The semiconductor device according to claim 14, wherein whether the transistor is on-state or off-state is controlled in accordance with a signal inputted to a gate of the transistor.

16. The semiconductor device according to claim 14, wherein the load comprises at least one of a resistor and a capacitor.

17. The semiconductor device according to claim 14, further comprising a rectifier circuit, a demodulation circuit, a constant voltage circuit and a logic circuit.

18. A cellular phone comprising the semiconductor device according to claim 14.

19. A semiconductor device comprising:
a load; and
a transistor, the transistor comprising an oxide semiconductor layer, the oxide semiconductor layer comprising a channel formation region, wherein the load is electrically connected to one of a source or a drain of the transistor,
wherein hydrogen concentration of the oxide semiconductor layer is less than or equal to $5\times10^{19}/cm^3$,
wherein an off-state current per channel width of the transistor is less than or equal to $1\times10^{-16}$ A/μm at a temperature within a range from −30° C. to 120° C.,
wherein the oxide semiconductor layer comprises indium, zinc and gallium, and
wherein the oxide semiconductor layer has a microcrystalline structure.

20. The semiconductor device according to claim 19, wherein whether the transistor is on-state or off-state is controlled in accordance with a signal inputted to a gate of the transistor.

21. The semiconductor device according to claim 19, wherein the load comprises at least one of a resistor and a capacitor.

* * * * *